United States Patent
El Zammar et al.

(10) Patent No.: US 10,553,741 B2
(45) Date of Patent: Feb. 4, 2020

(54) METHOD FOR PRODUCING A PHOTODIODE AND PHOTODIODE

(71) Applicant: COMMISSARIAT A L'ENERGIE ATOMIQUE ET AUX ENERGIES ALTERNATIVES, Paris (FR)

(72) Inventors: Georgio El Zammar, Grenoble (FR); Rami Khazaka, Grenoble (FR); Sylvie Menezo, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/413,054

(22) Filed: May 15, 2019

(65) Prior Publication Data

US 2019/0363212 A1   Nov. 28, 2019

(30) Foreign Application Priority Data

May 16, 2018   (FR) ...................... 18 54086

(51) Int. Cl.
*H01L 31/107* (2006.01)
*H01L 31/0203* (2014.01)
(Continued)

(52) U.S. Cl.
CPC ...... *H01L 31/1075* (2013.01); *H01L 31/0203* (2013.01); *H01L 31/028* (2013.01);
(Continued)

(58) Field of Classification Search
None
See application file for complete search history.

(56) References Cited

U.S. PATENT DOCUMENTS

| 9,048,371 | B2 * | 6/2015 | Ang | .................. H01L 31/1075 |
| 2015/0016769 | A1 * | 1/2015 | Verma | ............... G02B 6/12004 |
| | | | | 385/14 |

(Continued)

OTHER PUBLICATIONS

French Preliminary Search Report dated Feb. 5, 2019 in French Application 18 54086 filed on May 16, 2018 (with English Translation of Categories of Cited Documents).

(Continued)

*Primary Examiner* — J. E. Schoenholtz
(74) *Attorney, Agent, or Firm* — Oblon, McClelland, Maier & Neustadt, L.L.P.

(57) ABSTRACT

The subject matter of the invention is a method for producing a lateral photodiode comprising a layer surmounted by a first pattern comprising an absorption region interposed between two contact regions. After encapsulation of the first pattern, a cavity is formed between the contact regions by etching through openings, and then filled with a material constituting the absorption region by lateral epitaxy of this material from the lateral walls of the cavity. According to one possibility, a first lateral epitaxy is effected in order to form a multiplication region, and then a second lateral epitaxy is effected in order to form a charge region before the lateral epitaxy of the material constituting the absorption region, so as to obtain a lateral avalanche photodiode having improved optical confinement. The lateral photodiode according to the invention has improved optical confinement.

24 Claims, 18 Drawing Sheets

(51) Int. Cl.
    *H01L 31/036* (2006.01)
    *H01L 31/18* (2006.01)
    *H01L 31/0336* (2006.01)
    *H01L 31/0232* (2014.01)
    *H01L 31/028* (2006.01)
(52) U.S. Cl.
    CPC ...... *H01L 31/02327* (2013.01); *H01L 31/036* (2013.01); *H01L 31/0336* (2013.01); *H01L 31/1804* (2013.01)

(56) References Cited

U.S. PATENT DOCUMENTS

| | | | |
|---|---|---|---|
| 2015/0097256 A1* | 4/2015 | Ang | H01L 31/1075 257/432 |
| 2016/0155863 A1* | 6/2016 | Baehr-Jones | H01L 31/1808 250/338.4 |
| 2016/0204298 A1 | 7/2016 | Chen et al. | |

OTHER PUBLICATIONS

Leopold Virot, et al., "Integrated waveguide PIN photodiodes exploiting lateral Si/Ge/Si heterojunction", Optics Express, vol. 25, No. 16, Aug. 7, 2017, 10 Pages.
Leopold Virot, "Development of avalanche photodiodes in Ge on Si for weak signal and high speed detection", Optics/Photonic, Universite Paris Sud—Paris XI, 2014, 24 pages (with English Translation).
Nicholas J. D. Martinez, et al., "High performance waveguide-coupled Ge-on-Si linear mode avalanche photodiodes", Optics Express, vol. 24, No. 17, Aug. 22, 2016, 10 Pages.
U.S. Appl. No. 16/130,178, filed Sep. 13, 2018, U.S. Pat. No. 2019/0096671 A1, Rami Khazaka, et al.

\* cited by examiner

METHOD FOR PRODUCING A PHOTODIODE AND PHOTODIODE

TECHNICAL FIELD

The invention concerns the field of photonics and optoelectronics. It finds at least one particularly advantageous application in the field of photodetectors. One advantageous but non-limitative application will be the production of germanium avalanche photodiodes.

PRIOR ART

In the field of silicon photonics, a photodetector is an essential electronic component of optical communication systems integratable in CMOS technology.

One challenge related to the manufacture of photodetectors is increasing the light-detection sensitivity.

A principle for the detection of light in a photodetector or a photodiode is as follows:

A photon is absorbed in the absorption region of the photodiode. The absorption of this photon generates an electron-hole pair. The electron and the hole, referred to as electrical charge carriers, can then be collected via electrodes or contact regions. The electric current generated by these carriers can thus be used for detecting the photon giving rise to the phenomena.

A first photodiode architecture using this principle is a p-i-n photodiode comprising an absorption region and a non-doped material (i standing for intrinsic) interposed between two contact regions made from a doped material (p and n standing for the corresponding doping type).

Because of its absorption and conduction properties, and its compatibility with CMOS technologies, germanium (Ge) is generally used for manufacturing Ge photodiodes having a conventional Ge-p/Ge-i/Ge-n architecture.

A particularly interesting possibility for increasing the detection sensitivity of photodiodes is improving the confinement of the photons in the absorption region of the photodiode.

Confining the photons in the absorption region may result in an optical-index contrast between the materials of the absorption region and the surrounding materials.

The document "Development of Ge on Si avalanche photodiodes for weak-signal and high-speed detection, L. Virot, Université Paris Sud—Paris XI, 2014" discloses for example a p-i-n photodiode architecture using silicon (Si) and germanium (Ge).

Such a photodiode illustrated in FIG. 1 has a double Si-p/Ge-i/Si-n heterojunction. This architecture provides confinement of light that is improved compared with a conventional Ge photodiode.

The absorption region A interposed between the contact regions 1 and 2 of this double-heterojunction photodiode is formed by growth of Ge 3 from an Si germination layer 111. This manufacturing method gives rise to optical losses at the level of the germination layer 111 that impair the optical confinement in the absorption region A.

Another possibility for increasing the sensitivity of the detection of the photodiodes is to generate a plurality of carriers from a single carrier initially resulting from the absorption of a photon, so as to collect a significant and measurable current. This is the principle of carrier multiplication.

A second photodiode architecture using this multiplication principle is an avalanche photodiode comprising an absorption region and a multiplication region both interposed between two contact regions.

The document mentioned above discloses for example an avalanche photodiode architecture extending laterally. A photodiode of this type is illustrated in FIGS. 2A and 2B.

There also, a germination layer 111 is necessary to the formation of the absorption region A between the multiplication region M, a charge region C and the contact region 2.

One drawback of this implementation method is there also the appearance of optical losses at the level of the germination layer 111.

Another drawback of the method for producing such a photodiode is related to the formation of the charge region C. This charge region C is in fact generally obtained by ion implantation. Such implantation leads to a poorly defined doping profile as illustrated in FIG. 3, in particular at the level of the interface 142 between the charge region C and multiplication region M.

One object of the present invention is to at least partly overcome some of the drawbacks mentioned above.

According to a particular aspect, one object of the present invention is to propose a method for producing a natural photodiode aimed at optimising the optical confinement in the absorption region of the photodiode.

According to another aspect, one object of the present invention is to propose a lateral photodiode aimed at optimising the optical confinement in the absorption region of the photodiode.

The other objects, features and advantages of the present invention will emerge from an examination of the following description and the accompanying drawings. Naturally other advantages may be incorporated.

SUMMARY

To achieve this objective, a first aspect relates to a method for producing a photodiode comprising a first contact region, a second contact region and an absorption region all juxtaposed so as to extend parallel in a first direction, said absorption region being situated between the first and second contact regions in a second direction.

This method comprises the following steps:
  Providing a first substrate comprising a stack in a third direction of a first layer based on a first material on a second layer based on a second material different from the first material,
  Forming the first contact region at the level of the first layer,
  Forming the second contact region at the level of the first layer,
  Forming the absorption region at the level of the first layer.

Advantageously but non-limitatively, the formation of the absorption region comprises at least the following successive steps:
  Encapsulating the first layer, at least in a region corresponding to the absorption region, by means of an encapsulation layer,
  Forming at least one opening through the encapsulation layer so as to expose a region of the first layer,
  Forming a cavity at least at the level of the absorption region, said formation comprising a removal of the first material over the entire thickness of the first layer through at least one opening, the cavity comprising a bottom face based on the second material of the second layer, a top face formed by a part of the encapsulation layer and a plurality of lateral walls extending in the third direction, said plurality comprising at least one lateral wall based on the first material extending in the first direction at the edge of one from among the first and second contact regions, Filling, through the at least one opening, the cavity with a third filling material by lateral epitaxial growth of said material at least from the at least one lateral wall of the cavity, the growth being mainly directed in the second direction.

This method advantageously makes it possible to dispense with a germination layer on the bottom face of the cavity for growth of the filling material. The optical confinement in the absorption region of the photodiode can thus be improved by eliminating the optical losses caused by the germination layer.

In order to increase the confinement of light in germanium, an advantageous solution consists of forming the germanium absorption region directly on an oxide. The optical index contrast is thus optimised and the confinement of the photons is improved. Such a method is based on a stack of the GeOI type (according to the English acronym "Germanium On Insulator").

Particularly advantageously, the absorption region is formed by filling the cavity from its lateral walls, between the first and second contact regions on the one hand, and between the second layer and the encapsulation layer on the other hand.

The method therefore makes it possible to ensure continuity for the electrical transport of the charge carriers between the first and second contact regions.

The relative arrangement of the contact and absorption regions confers on the photodiode a so-called lateral architecture, where the charge carriers generated in the absorption region are directed in the second direction before being collected at the level of the contact regions.

The method also makes it possible to produce locally a structure of the GeOI type. The optical confinement in the absorption region in the third direction can consequently be improved compared with a conventional Ge structure comprising for example a germination layer configured to grow the material of the absorption region in the third direction.

Such an improvement is advantageously applicable to various photodiode architectures.

In particular, this method is compatible with producing p-i-n GeOI photodiodes and/or avalanche GeOI photodiodes.

According to a preferred embodiment, the plurality of lateral walls of the cavity form a closed contour. The filling of the cavity by lateral growth mainly in the second direction is consequently constrained in the first direction. The filling is thus better controlled.

According to a particularly advantageous but non-limitative possibility, the method further comprises, when the cavity is formed after removal of the first material, the following steps:

Forming, on at least one lateral wall bordering at least one from among the first and second contact regions, a first lateral layer made from a material based on the first material but differing from the first material, intended to form a multiplication layer of the photodiode, and Preferably but optionally after formation of the first lateral layer, forming, on at least one lateral wall of the first lateral layer, a second lateral layer based on the first material but different from the first material and from the material of the first lateral layer, intended to form a charge layer of the photodiode.

According to this possibility, the method makes it possible to form an avalanche GeOI photodiode having separate multiplication and charge regions. This photodiode structure is referred to as SACM (the acronym of "Separate Absorption, Charge and Multiplication).

According to an advantageous embodiment, the second lateral layer is formed by a lateral epitaxial growth mainly in the second direction. This makes it possible to obtain a well-defined and uniform charge region, unlike the charge regions obtained conventionally by ion implantation.

An avalanche GeOI photodiode based on such an SACM structure epitaxed laterally has optimised functioning.

This structure makes it possible in fact to obtain an interface between the charge and multiplication regions that is very well defined. Consequently the electrical field in the photodiode can vary very rapidly at this interface. This variation is advantageously more rapid than a variation in electrical field occurring at an interface resulting from a charge region produced by implantation.

Moreover, this laterally epitaxed SACM structure makes it possible to obtain a second lateral layer both highly doped and narrow. Consequently the electrical field can be high in the multiplication region. In particular, the electrical field is higher in the multiplication region bordering such a second lateral layer than in a multiplication region bordering a charge region produced by implantation.

The photodiode produced by the method can advantageously equip a photodetector in the silicon photonics field.

A separable aspect relates to a photodiode comprising a first contact region, a second contact region and an absorption region all formed in a first layer based on a first material and juxtaposed so as to extend parallel in a first direction, said absorption region being situated between the first and second contact regions in a second direction, the first layer being in contact with a second layer based on a second material different from the first material, in a third direction perpendicular to the first and second directions. The absorption region is located in a cavity in the first layer. It confines the light.

Advantageously, the absorption region is formed directly in contact with the second material of the second layer, preferentially over the entire thickness of the first layer, and comprises a third material differing from the first and second materials.

Such a lateral photodiode makes it possible to optimise the optical confinement in the absorption region of the photodiode.

In particular, the contrast in index between the second and third materials can advantageously be greater than the contrast in index between the first and third materials.

According to one possibility, the first material is silicon, the second material is a dielectric material such as silicon oxide, and the third material is germanium.

The photodiode can therefore advantageously be a GeOI lateral photodiode in which the Ge absorption region is directly in contact with the silicon oxide of the underlying second layer.

According to an advantageous embodiment, the photodiode further comprises a multiplication region and a charge region both formed over the entire thickness of the first layer and interposed between the first contact region and the absorption region.

The photodiode can therefore advantageously be an avalanche GeOI lateral photodiode.

The photodiode can be produced by the method according to the first aspect.

The photodiode can advantageously equip a photodetector in the silicon photonics field.

BRIEF DESCRIPTION OF THE FIGURES

The aims, objects, features and advantages will emerge better from the detailed description of embodiments thereof that are illustrated by the following accompanying drawings, in which.

The figures bearing the same number indexed A and B illustrate the same step of the method respectively in cross section and in plan view.

Figure 1:
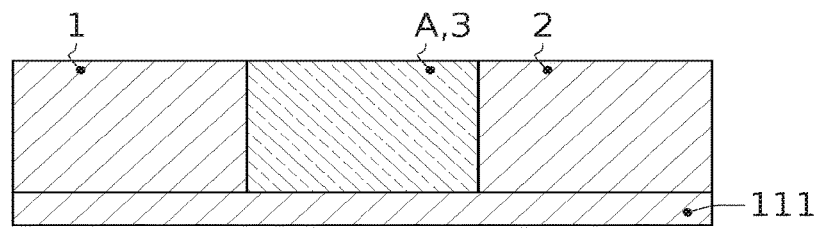
FIG. 1 is a view in cross section of a double-heterojunction lateral photodiode according to the prior art.
Figure 2A:
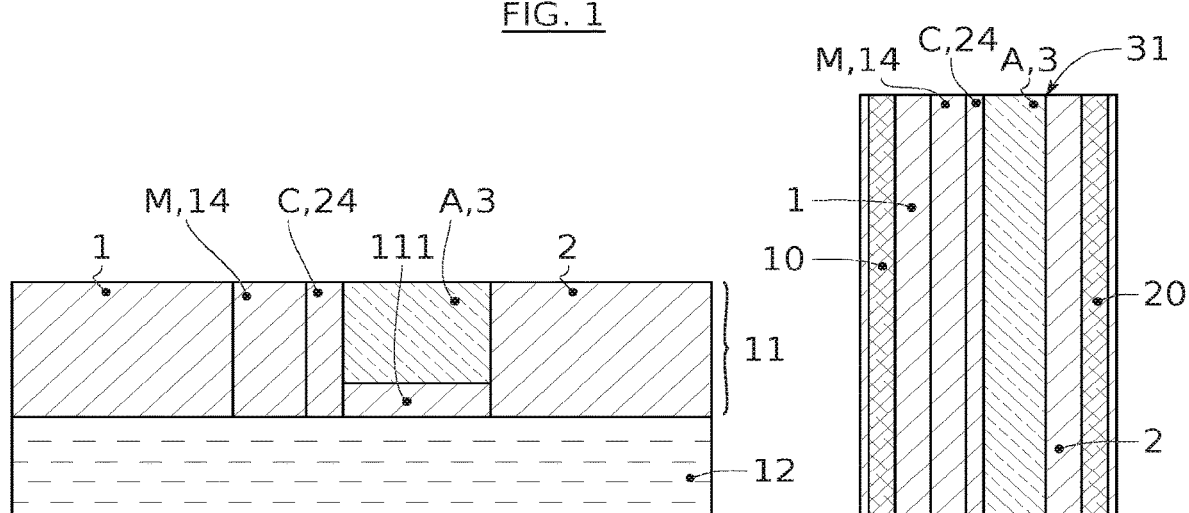
FIG. 2a is a diagram in cross section of an avalanche lateral photodiode produced according to the prior art.
Figure 2B:
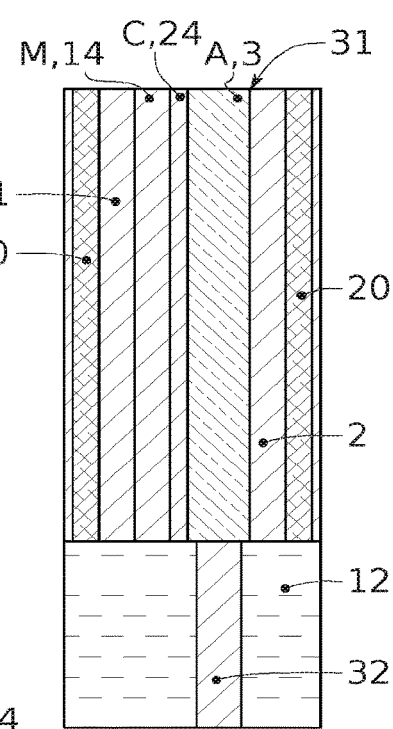
FIG. 2b is a diagram seen from above of an avalanche lateral photodiode produced according to the prior art.

The drawings are given by way of examples and are not limitative of the invention. They constitute outline schematic representations intended to facilitate understanding of the invention and are not necessarily to the scale of practical applications. In particular, the thicknesses and dimensions of the various layers and portions of the photodiodes illustrated do not represent reality.

DETAILED DESCRIPTION

Before beginning a detailed review of embodiments of the invention, it is stated that the invention according to the first aspect thereof comprises in particular the following optional features that can be used in association or alternatively:

The formation of the at least one opening is configured so that the exposed region of the first layer is situated outside the absorption region, preferably at a distance greater than 1 μm from the absorption region.

The first and third materials each have a crystallographic structure of the cubic type, and the first direction corresponds to a crystallographic orientation of type [100], the second direction corresponds to a crystallographic orientation of the [010] type, and the third direction corresponds to a crystallographic orientation of the [001] type.

The method further comprises, when the cavity is formed after removal of the first material, the following step:

Forming, by lateral epitaxial growth mainly in the second direction, on at least one lateral wall bordering at least one from among the first and second contact regions, a first lateral layer of a material based on the first material but different from the first material, intended to form a multiplication layer of the photodiode.

The formation of the first lateral layer is performed by a lateral epitaxial growth mainly in the second direction.

The method further comprises, after the formation of the first lateral layer, the following step:

Forming, on at least one lateral wall of the at least one first lateral layer, at least one second lateral layer based on the first material but different from the first material and from the material of the first lateral layer, intended to form a charge layer of the photodiode.

The formation of the second lateral layer is performed by a lateral epitaxial growth mainly in the second direction.

The first substrate comprises a third layer, so that the second layer is interposed between the first and third layers in the third direction, the method further comprising a sequence of steps of turning over the photodiode on a second substrate, said sequence comprising the following steps:

Providing a second substrate,

Bonding the second substrate by molecular adhesion to the first substrate in the third direction, the first layer of the first substrate being turned facing the second substrate, Removing the third layer from the first substrate.

The method further comprises a formation, at the level of the top layer, of a waveguide in direct coupling with the absorption region.

The at least one opening has a closed contour and is distant from the first contact region by a distance d in the second direction such that 0.6 μm<d<1.5 μm and preferably 1.1 μm<d<1.5 μm.

The at least one lateral wall based on the first material extending in the first direction comprises a first lateral wall and a second lateral wall facing the first lateral wall, and the at least one opening is situated at equal distances from said first and second lateral walls in the second direction.

The lateral epitaxial growth of the filling material takes place at a first temperature T1 over a first time t1 such that 400° C.<T1<450° C. and 1 min<t1<20 min, and then at a second temperature T2 between 600° C. et 750° C. over a second time t2 chosen so as to fill the entire cavity.

The first material, when the cavity is formed, is removed by etching, said etching being configured so as to produce an etching speed at least 25% greater in crystallographic directions [110] and [1-10] than in crystallographic directions [010] and [100] of the first material of the first layer, and preferably at least 35% greater.

The first material is silicon, the second material is a dielectric material such as a silicon oxide, and the third material is germanium.

The method further comprises a formation of an additional cavity juxtaposed with the cavity and extending parallel thereto in the first direction, said formation comprising the following steps:

Encapsulating the first layer, at least in a region juxtaposed with the cavity, by means of an encapsulation layer, Forming at least one additional opening through the encapsulation layer so as to expose a region of the first layer at the level of the region juxtaposed with the cavity, Removing the first material over the entire thickness of the first layer through the at least one additional opening, said additional cavity comprising a bottom face based on the second material of the second layer, a top face formed by a part of the encapsulation layer and a plurality of lateral walls extending in the third direction, said plurality comprising at least one lateral wall based on the first material extending in the first direction at the edge of the cavity.

The additional cavity is formed after filling of the cavity.

The formation of the additional cavity is configured so that said additional cavity is separated from the cavity in the second direction by a layer based on the first material having a dimension in said second direction that is less than or equal to 50 nm.

The method further comprises, after formation of the additional cavity, a filling of said additional cavity through the at least one additional opening with the third filling material by a lateral epitaxial growth of said material at least from the at least one lateral wall of the additional cavity, the growth being mainly directed in the second direction.

The formation of one from among the first and second contact regions is done by ion implantation at least partly at the level of the additional cavity after filling thereof.

The invention according to the second aspect thereof comprises in particular the following optional features that can be used in association or alternatively:

The photodiode further comprises a multiplication region formed over the entire thickness of the first layer and interposed between the first contact region and the absorption region.

The photodiode further comprises a charge region formed over the entire thickness of the first layer and interposed between the multiplication region and the absorption region.

The multiplication region (M) is configured so as to form a lateral growth base of the charge region (C).

The charge and multiplication regions have a flat interface between them.

A flat interface of this type enables the electrical field developing in the photodiode to vary very quickly at this interface between the charge and multiplication regions. Consequently the impact ionisation resulting from the electrical field begins to occur very close to such an interface, in the multiplication layer. The efficacy of the multiplication layer is advantageously increased. Such a flat interface also makes it possible to reduce the width of the charge region.

The first material is silicon, the second material is a dielectric material such as a silicon oxide, and the third material is germanium.

The index contrast between the second and third materials is greater than the index contrast between the first and third materials.

Hereinafter, the avalanche photodiode preferably has a so-called SAM or SACM configuration. These configurations are in particular based on a separation S of the absorption region A, charge region C and multiplication region M.

An absorption region is a region configured to at least partly absorb the photons of an incident light flow and to generate in response electrical charge carriers, said generation of charges resulting from the absorption phenomenon. The absorption region is preferably made from germanium in the present application.

A multiplication region is a region configured to multiply the electrical charges generated in the absorption region. This multiplication may take place by impact ionisation of the atoms of the multiplication region. This impact ionisation may be triggered and assisted by a high biasing voltage in said multiplication region. The multiplication region is preferably made from intrinsic silicon in the present application.

A charge region is a region configured to screen vis-à-vis the absorption region an electrical field developing in the multiplication region. The function of this charge region is to reduce, at the level of the absorption region, the speed of the charges accelerated by said electrical field in the direction of the multiplication region. The charge region is preferably made from p+ doped silicon in the present application.

It is stated that, in the context of the present invention, the relative arrangement of a third region interposed between a first region and a second region does not necessarily mean that the regions are directly in contact with one another, but means that the first region is either directly in contact with the first and second regions, or separated therefrom by at least one other region or at least one other element.

The steps of formation of the regions, in particular the contact and absorption regions, should be taken in the broad sense: they may be carried out in a plurality of substeps that are not necessarily strictly successive.

In the present invention doping types are indicated. These dopings are non-limitative examples. The invention covers all embodiments in which the dopings are reversed. Thus, if an example embodiment mentions for a first region a p doping and for a second region an n doping, the present description then, implicitly at least, describes the reverse example in which the first region has an n doping and the second region a p doping.

The doping ranges associated with the various doping types indicated in the present application are as follows:
p++ or n++ doping: greater than $1 \times 10^{20}$ cm$^{-3}$
p+ or n+ doping: $1 \times 10^{18}$ cm$^{-3}$ to $9 \times 10^{19}$ cm$^{-3}$
p or n doping: $1 \times 10^{17}$ cm$^{-3}$ to $1 \times 10^{18}$ cm$^{-3}$
intrinsic doping: $1.10^{15}$ cm$^{-3}$ to $1.10^{17}$ cm$^{-3}$ Hereinafter, the following abbreviations relating to a material M are optionally used:

M-i refers to the intrinsic or not intentionally doped material, according to the terminology normally used in the field of microelectronics for the suffix -i.

M-n refers to the n, n+ or n++ doped material M, according to the terminology normally used in the field of microelectronics for the suffix -n.

M-p refers to the p, p+ or p++ doped material M, according to the terminology normally used in the field of microelectronics for the suffix -p.

A substrate, a film or a layer "based" on a material M means a substrate, a film or a layer comprising solely this material M or this material M and optionally other materials, for example alloy elements, impurities or doping elements. Thus a layer made from a material based on germanium (Ge) may for example be a layer of germanium (Ge or Ge-i) or a layer of doped germanium (Ge-p, Ge-n) or a layer of silicon-germanium (SiGe). A layer made from a material based on silicon (Si) may for example be a layer of silicon (Si or Si-i) or a layer of doped silicon (Si-p, Si-n).

In the present patent application, the first, second and third directions correspond respectively to the directions carried by the x, y, z axes of a preferably orthonormal reference frame. This reference frame is shown in the figures appended to the present patent application.

Hereinafter, the length is taken in the first direction x, the width is taken in the second direction y, and the thickness is taken in the third direction z.

"Lateral" means, according to circumstances: an orientation of the walls or layers normal to y, an epitaxial growth directed along y, or an arrangement along y of the various active regions or elements of the photodiode relative to one another.

Figure 3:
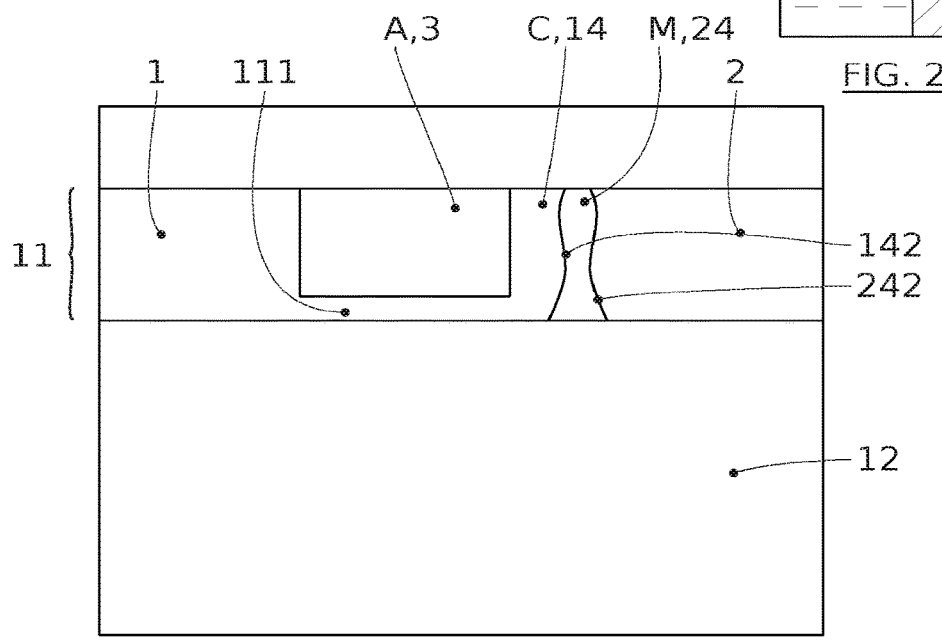
FIG. 3 is a simulation in cross section of an avalanche lateral photodiode produced according to the prior art.
Figure 4:
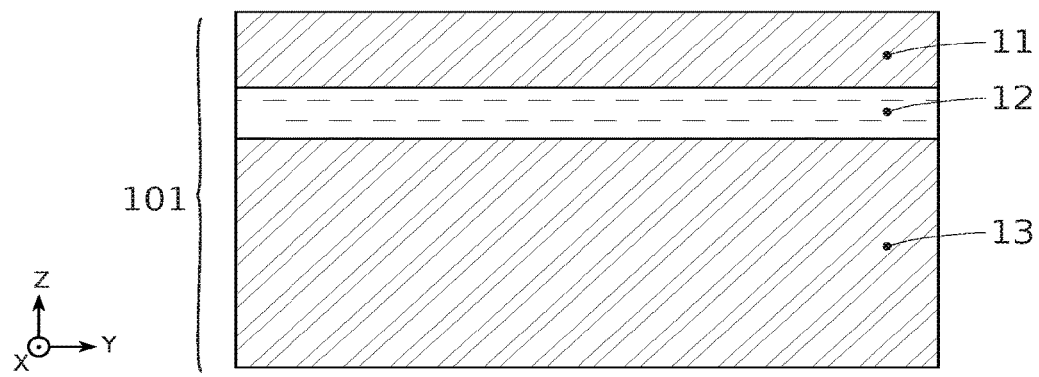
FIGS. 4 to 19B illustrate steps of producing a photodiode according to a first embodiment of the present invention.

In order to determine the geometry of the interfaces between the various doped and non-doped or intrinsic regions, scanning electron microscopy (SEM) or transmission electronic microscopy (TEM) analyses can be carried out. An epitaxial growth of one material or another produces a clearly defined and substantially planar interface between these materials. On the other hand, an implantation of elements in a region forming an interface with another region produces a poorly defined and potentially non-planar interface between these regions. FIG. 3 shows such poorly defined interfaces issuing from a result of ion implantation simulation by methods of the Monte Carlo type. TRIM and SRIM software for example make it possible to implement these methods and to obtain these results. Other methods, for example finite element methods (FEMs), may also make it possible to obtain these results.

The chemical compositions of the various regions can be determined by means of the following well-known methods such as:

EDX or X-EDS, the acronym for "Energy Dispersive X-ray Spectroscopy".

This method is well suited to analysing the composition of small devices such as avalanche photodiodes comprising a thin multiplication region and optionally a thin charge region. It can be implemented on metallurgical sections in a scanning electron microscope (SEM) or on thin slices in a transmission electron microscope (TEM).

SIMS, the acronym for "Secondary Ion Mass Spectroscopy".

ToF-SIMS, the acronym for "Time of Flight Secondary Ion Mass Spectroscopy".

These methods make it possible to access the elementary composition of the regions.

A first embodiment of the method according to the invention will now be described with reference to FIGS. 4 to 19B. The photodiode obtained by this first embodiment is a lateral avalanche photodiode comprising various regions interposed along y between a first contact region 1 and a second contact region 2. These various regions preferably comprise a multiplication region M, a charge region C and an absorption region A.

A first step consists of providing a substrate 101 (FIG. 4), preferably SOI (the acronym for "Silicon on Insulator"; but materials other than silicon are also possible). The first silicon layer 11, also referred to as top Si hereinafter, preferably has a thickness of between 100 nm and 700 nm, preferably substantially equal to 300 nm. The second silicon dioxide layer 12, also referred to as BOX (the acronym for "buried oxide") preferably has a thickness of between 10 nm and 100 nm, preferably substantially equal to 20 nm. The third layer 13 is made from silicon and may also be referred to as bulk Si hereinafter.

This substrate may have a diameter of 200 mm or 300 mm.

Figure 5:
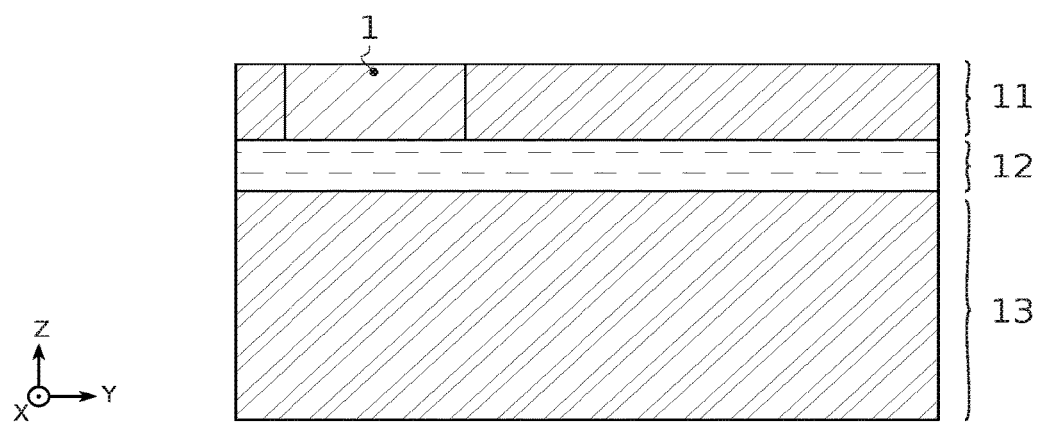

The following step consists of forming the first contact region 1 at the level of the first layer 11, preferably by ion implantation (FIG. 5). This first contact region 1 may be n++ doped and have a concentration of dopants of between 1 and $3\times10^{19}$ cm$^{-3}$. It may have a width of around 15 μm.

Figure 6A:
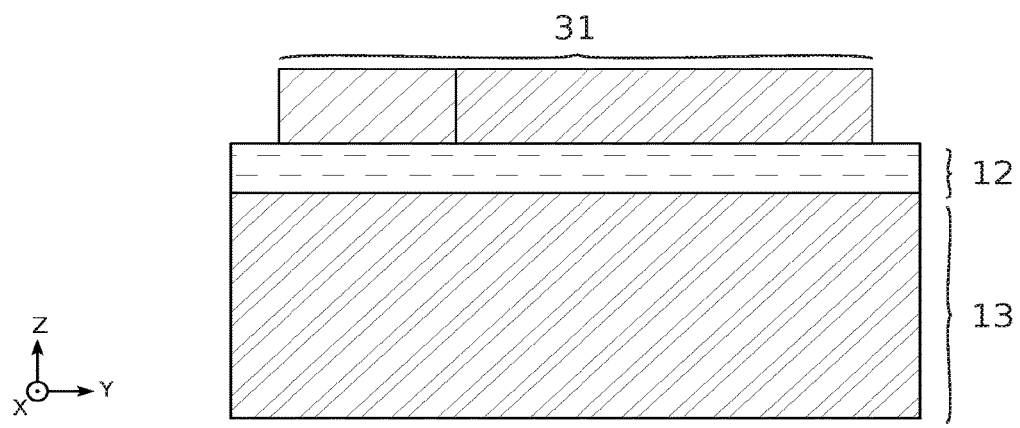
Figure 6B:
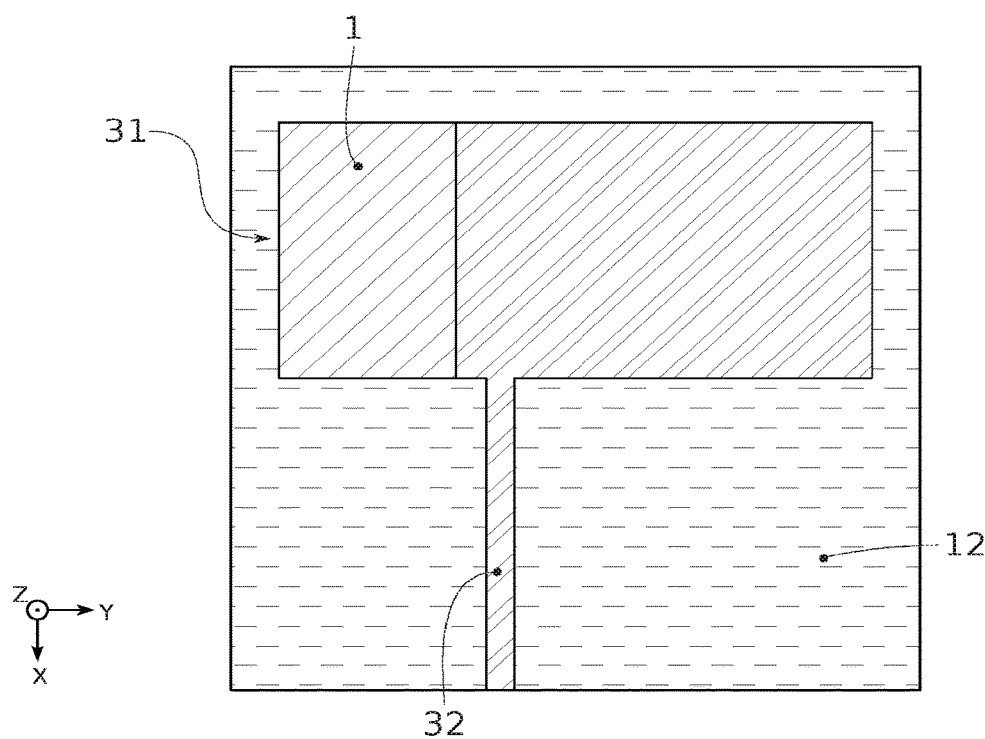

A step of defining a first pattern 31 comprising the first contact region 1, the absorption region A and the second contact region 2 is preferably carried out by lithography and selective etching of the top Si over the entire height thereof (FIG. 6A). The selective etching of the top Si 11 with respect to the BOX 12 made from silicon dioxide is widely known and is not characteristic of the present invention.

The definition of a second pattern in the form of a waveguide 32 is also carried out by lithography and selective etching of the top Si over the entire height thereof (FIG. 6B), preferably when the first pattern 31 is defined.

This waveguide 32 is preferably configured to cooperate with the absorption region A by direct coupling. The waveguide 32 preferably has continuity with the absorption region A of the first pattern 31.

The waveguide 32 may be centred or not on the absorption region A. It may have a width of between 300 nm and 600 nm, preferably around 400 nm. The height thereof may be equal to that of the top Si 11.

Figure 7:
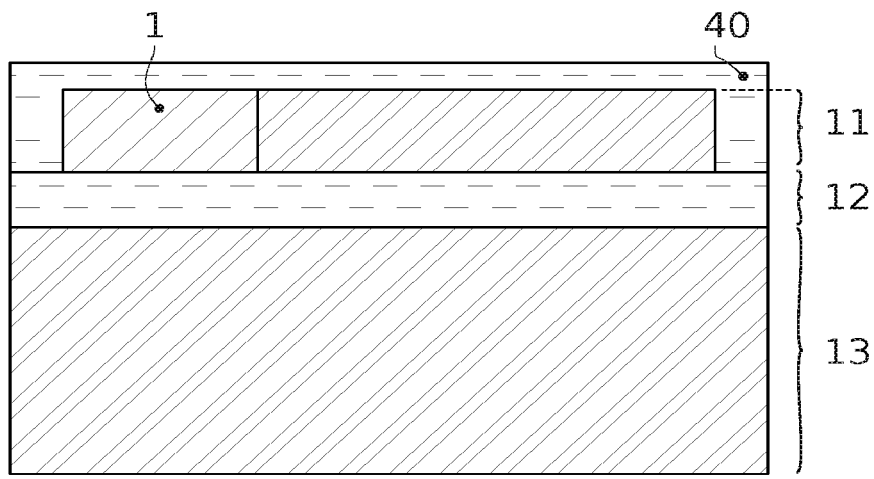

An encapsulation step is next carried out so as to cover the first and second patterns 31, 32 with an encapsulation layer 40 (FIG. 7).

The encapsulation layer 40 may be deposited by a chemical vapour deposition (CVD) method and is preferably conforming. The encapsulation layer 40 preferably has a thickness of between 50 nm and 150 nm. It may be a layer of oxide, for example a layer of silicon dioxide.

Figure 8:
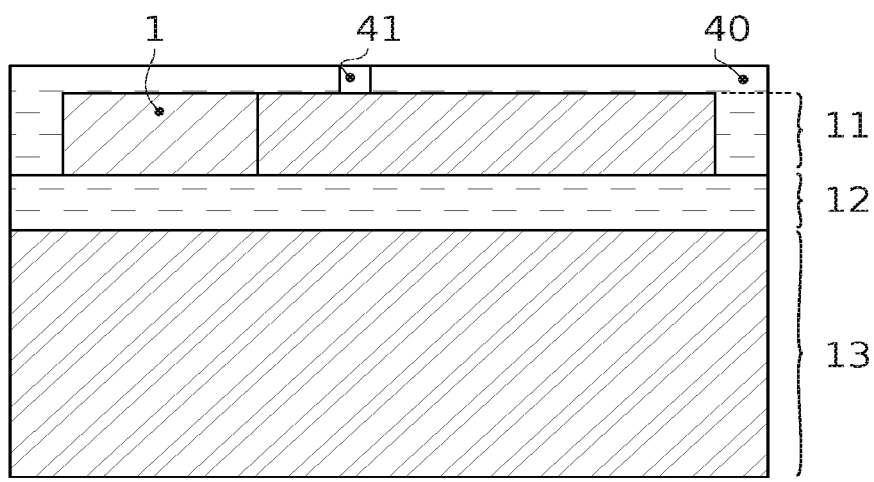

After encapsulation, one or more openings 41 are formed through the encapsulation layer 40 over the entire thickness thereof so as to expose regions of top Si 11 (FIG. 8). These openings 41 may be formed at the end of conventional lithography/etching steps. The openings 41 preferably have a circular cross section having a diameter of between 50 nm and 200 nm, preferably around 100 nm. More generally, the largest dimension in cross section in the plane xy of the openings 41 is preferably less than or equal to 200 nm and/or greater than or equal to 50 nm.

These openings 41 are preferably situated at a distance d along y of the first contact region 1 such that 0.6 μm<d≤1.5 μm and preferably d≈1.5 μm. This makes it possible to distance the openings 41 from the first contact region 1. The openings in fact constitute singularities that may give rise to certain problems during following steps of the method, in particular when filling a cavity 42 formed after opening of the encapsulation layer 40. Consequently it is advantageous to form the openings 41 as far as possible from the first contact region 1 and/or from the absorption region A, so that the passage of the electrical charges and/or of the light flow is not disturbed by the singularities formed by these openings 41.

The openings 41 are preferably regularly spaced apart from each other along x, for example by a distance D≤2d.

According to one advantageous possibility, the positioning of the openings 41 is chosen so that the cavity 42 has a rectangular cross section in the plane xy before filling of said cavity 42 by the filling material 3.

Figure 9A:
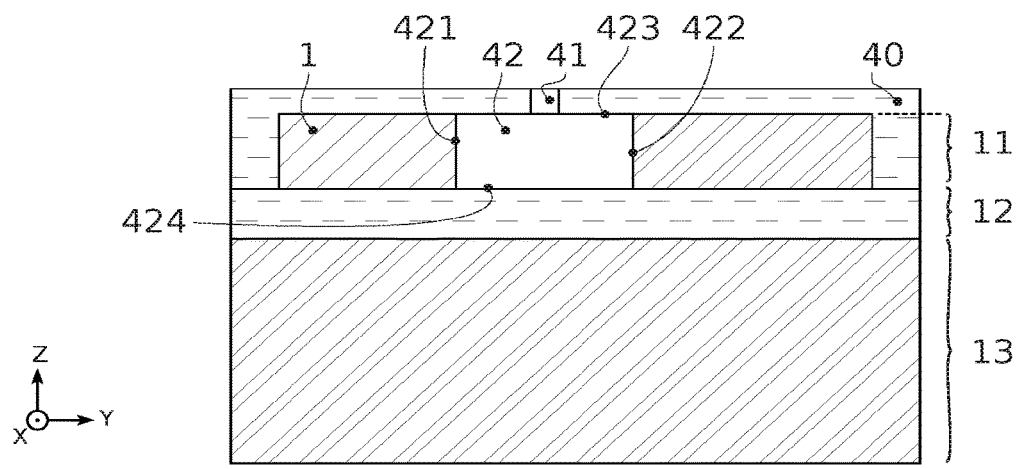

After opening of the encapsulation layer 40, a step of etching the top Si 11 selectively with respect to the silicon dioxide of the encapsulation layer 40 and the BOX 12 is performed through the openings 41, so as to form alveoli underlying the openings 41 (FIG. 9A).

An alveolus corresponds to an opening 41 at least at the start of the etching. The alveoli are preferably centred on the corresponding openings 41.

Figure 9B:
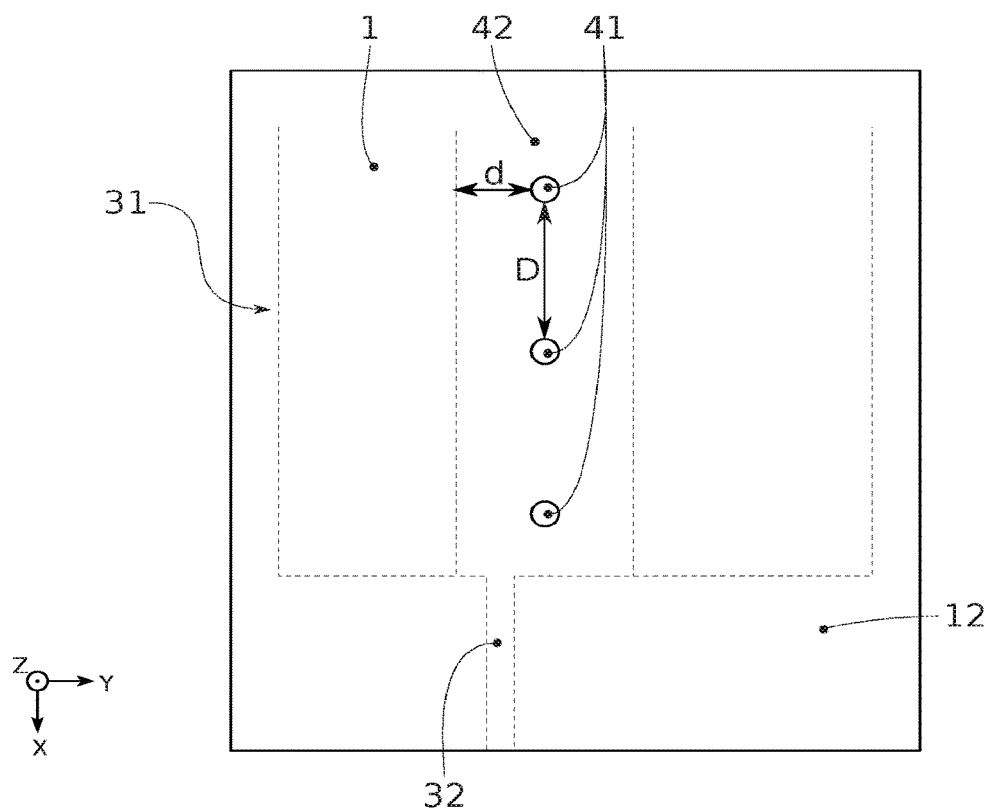

These alveoli may advantageously have an overlap with each other so as to form the cavity 42 at the end of etching, as illustrated in plan view in FIG. 9B.

This cavity 42 can therefore optionally result from a plurality of aggregated alveoli.

The cavity 42 preferably has a width of around 3 μm, a length of between 10 μm and 20 μm depending on the number of openings 41, and a height substantially equal to the height of the top Si 11.

The etching is here configured so as to produce alveoli and, therefore, the cavity 42 with controlled shape and orientation.

Along z, the alveoli advantageously extend over the entire height of the top Si, between a bottom face 424 formed by an exposed part of the BOX 12 and a top face 423 formed by an exposed part of the encapsulation layer 40.

Along x and y, the alveoli preferably extend in a substantially square cross section in the plane xy, the sides of the square being aligned along x and y.

In the case of the etching of the top Si 11, and more generally for materials having a crystallographic structure of the centred-face cubic or zinc blende type, such a square shape can advantageously be obtained by anisotropic etching.

Such anisotropic etching is in particular more rapid in the densest planes of the crystal.

According to one embodiment, the etching, dry or wet, is configured so as to obtain an etching speed in the crystallographic directions [110] and [1-10], greater by at least 25% and preferably at least 35% than the etching speed in the directions [010] and [100].

The directions of the greatest speeds will define the diagonals of a square, to within implementation tolerances. Because of this, the sides of the square are oriented in the crystallographic direction [100] or perpendicular to this direction.

The sides of each cavity 42 along x and y therefore preferentially extend respectively in the crystallographic directions [100] and [010].

In the case of the etching of the top Si 11, chemical etching using a flow of hydrochloric acid HCl vapour at a temperature below 850° C., preferably below 820° C., can advantageously be used. The pressure in the etching chamber may be between 10 Torr and atmospheric pressure, and preferably equal to 80 Torr. The flow of HCL delivered may be between 1 slm and 25 slm (slm is the acronym for "standard litres per minute"), and preferably 15 slm. A flow of $H_2$ may also be added, for example between approximately 1 slm and 40 slm, preferably 20 slm.

These etching conditions preferably make it possible to limit the etching regime by surface reaction, so as to produce an anisotropic etching of the top Si 11.

According to another possibility, the etching is wet etching through the openings 41. In the case of the top Si 11, a preferably aqueous solution comprising potassium hydroxide may be used. Wet etching applied to a confined space makes it possible to obtain different etching speeds in the crystallographic directions.

During etching, the first and second lateral walls parallel to x of each of the alveoli progress respectively in the direction of the first and second contact regions 1, 2, while the third and/or fourth lateral walls of two adjacent alveoli progress towards one another.

The etching time is preferably chosen so that the alveoli resulting from each opening 41 join together so as to form the cavity 42 at the end of etching.

The etching is preferably configured so that the lateral wall 421 along x of the cavity 42 corresponds to an edge of the first contact region 1.

In particular, the etching time can be controlled so as to stop the etching of the top Si 11 when the etching front progressing along y in the direction of the first contact region 1 reaches the edge of this first contact region 1. According to a preferred possibility, the etching is stopped after having reached the edge of the region initially implanted in order to form the contact region 1. The lateral wall 421 defining the edge of the first contact region 1 is consequently situated after etching inside the initially implanted region.

Figure 10:
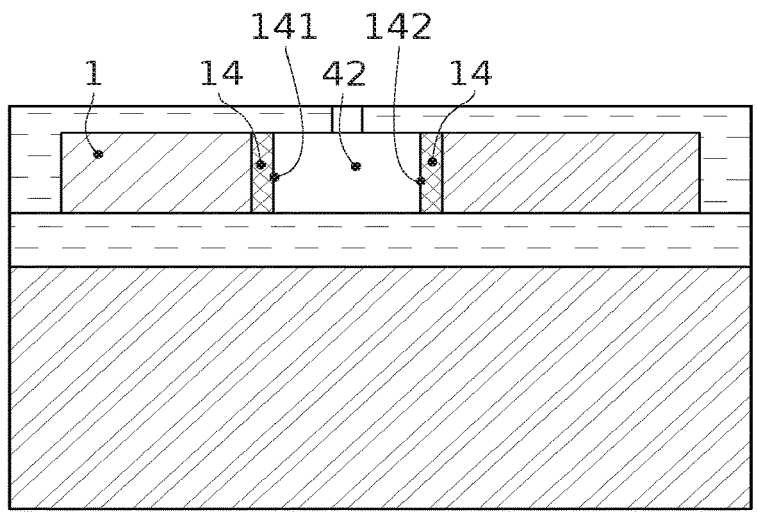

According to this first embodiment aimed at obtaining an avalanche photodiode, a first lateral epitaxy of intrinsic silicon is effected so as to form a first layer 14 on the lateral walls 421, 422 of the cavity 42 (FIG. 10). This first layer 14 preferably corresponds to the multiplication region M of the avalanche photodiode. It may have length and height dimensions equal to those of the cavity 42, and a width of between 100 nm and 200 nm.

At the end of this first epitaxy, the width of the cavity 42 is thus reduced. The lateral walls 421, 422 of the cavity 42 consequently correspond to the exposed faces 141, 142 of the epitaxed first layer 14.

Figure 11:
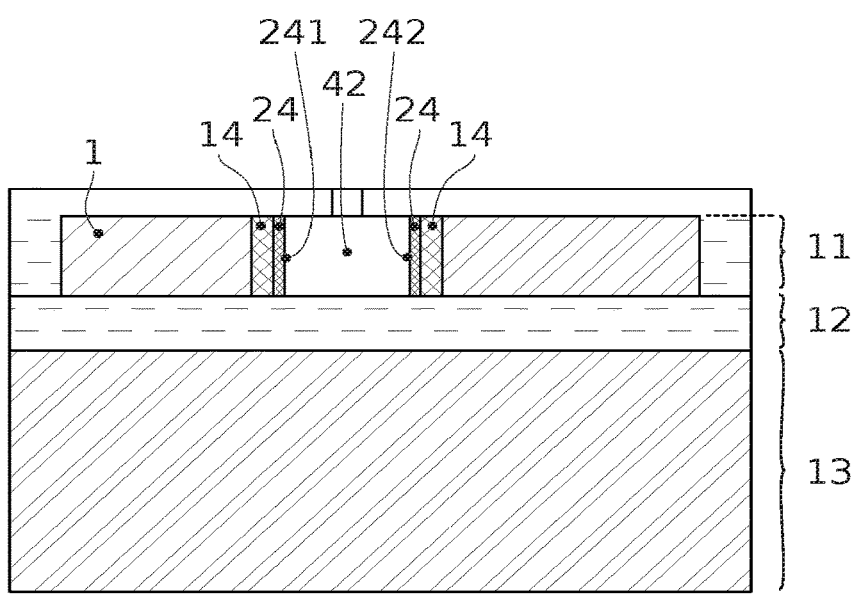

Preferably but optionally, a second lateral epitaxy of doped silicon Si-p is effected so as to form a second layer 24 on the lateral walls 421, 422 of the cavity 42, that is to say on the exposed faces 141, 142 of the first layer 14 (FIG. 11). This second layer 24 preferably corresponds to the charge region C of the avalanche photodiode. It may have length and height dimensions equal to those of the cavity 42, and a width of between 20 nm and 100 nm. The doping of this second layer 24 may be between $10^{17}$ cm$^{-3}$ and $10^{18}$ cm$^{-3}$ approximately. For a width of 30 nm for example, the doping is preferably substantially equal to $10^{18}$ cm$^{-3}$. For a width of 100 nm for example, the doping is preferably substantially equal to $10^{17}$ cm$^{-3}$.

Such a charge region C obtained by lateral epitaxy advantageously has a uniform and very well controlled width and doping, unlike a charge zone obtained by ion implantation for example.

At the end of this second epitaxy, the width of the cavity 42 is further reduced. The lateral walls 421, 422 of the cavity 42 consequently correspond to the exposed faces 241, 242 of the epitaxed second layer 24.

According to one advantageous possibility for the embodiments aimed at obtaining an avalanche photodiode, the opening 41 in the immediate vicinity of the waveguide 32 is positioned along x so that the etching front progressing along x in the direction of the waveguide 32 stops in the waveguide 32. A removal of material along x at the level of the waveguide 32 is thus obtained after etching of the top Si 11, so as to take account of an addition of material during the first and/or second epitaxies of Si-i and Si-p at the level of this waveguide 32. This positioning of the opening 41 in the vicinity of the waveguide 32 is thus advantageously chosen so that the single large cavity has a rectangular cross section in the plane xy after the first and/or second epitaxies of Si-i and Si-p. The opening 41 in the immediate vicinity of the waveguide 32 is also positioned along y at the distance d so that the first and/or second layers 14, 24 growing from the waveguide 32 and from the first contact region 1 join in order to form a corner of the cavity 42.

Figure 12:
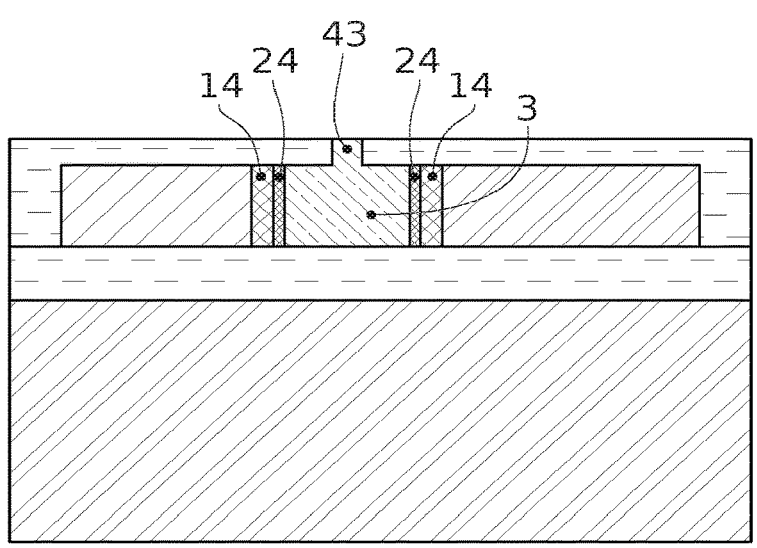

The cavity 42 is next filled by lateral epitaxy of germanium 3 so as to form the absorption region A of the photodiode (FIG. 12).

The germanium 3 is thus advantageously epitaxed on the silicon-based lateral walls 421, 422 of the cavity 42.

This epitaxy is preferably carried out using chemistry based on a germanium $GeH_4$ precursor in gaseous phase. An addition of hydrochloric acid HCl in gaseous phase can advantageously make it possible to avoid excessive fouling of the walls of the chamber of the epitaxy frame during epitaxy.

The lateral epitaxy of germanium is preferably carried out in two stages at a first "low" temperature and then at a second "high" temperature. The first "low" temperature makes it possible to reduce epitaxy defects, and the second "high" temperature makes it possible to benefit from high growth speeds compatible with filling of a large cavity. Such a "high" temperature also makes it possible to distribute more uniformly any dislocations present in the epitaxed germanium by virtue of greater mobility of said dislocations, and to potentially minimise the density thereof by recombination/annihilation of dislocations.

For example, the lateral epitaxy of germanium can be carried out at a "low" temperature of around 400° C. and at a pressure of around 100 Torr for a period of between 5 minutes and 15 minutes, then at a "high" temperature of around 600° C. to 700° C. and at a pressure of around 20 Torr for a period of between 5 minutes and 60 minutes.

The lateral epitaxy of germanium can advantageously be continued until the germanium 3 at least partially fills the openings 41.

The etching of the top Si 11, the first and second epitaxies of Si-i and Si-p and the epitaxy of germanium can advantageously take place in the same frame, so as to avoid oxidation of the lateral walls 421, 422 before each epitaxy.

After filling of the cavity 42 by lateral epitaxy of the germanium, an optional thermal cycling step under $H_2$ at temperatures varying between 750° C. and 890° C. on short cycles of a few minutes can advantageously make it possible to reduce the density of dislocations in the germanium 3.

Figure 13:
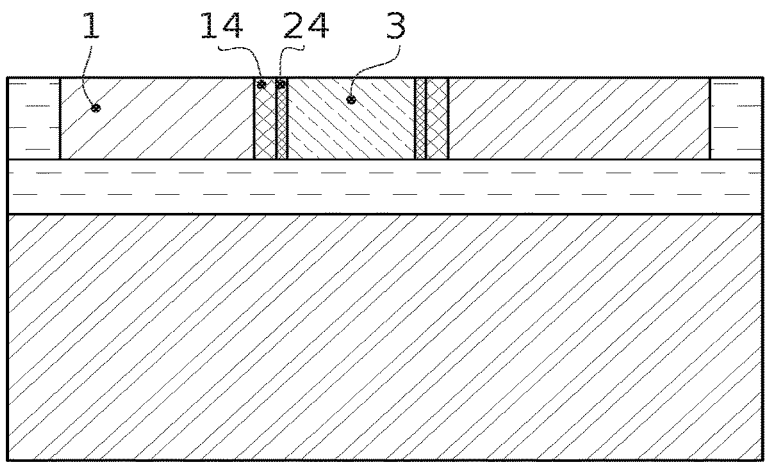

Optionally, a planarisation step comprising for example an anisotropic etching of the encapsulation layer 40 and a chemical mechanical polishing (CMP) as far as the top Si 11 can be carried out so as to remove any protrusion 43 of the germanium at the level of the openings 41 (FIG. 13). The confinement of light in the germanium is in fact modified according to the presence or not of such protrusion 43.

Figure 14:
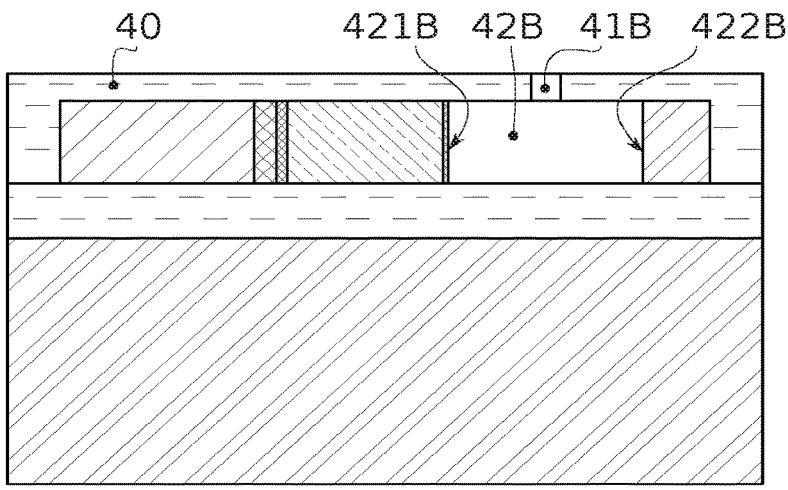

According to this first embodiment, an additional cavity 42b is formed at the edge of the cavity 42 filled with the germanium 3, on a side parallel to x and opposite to the first contact region 1 (FIG. 14).

This additional cavity 42b is preferably formed in accordance with the same formation methods as those used for forming the cavity 42 disclosed above.

The additional cavity 42b has lateral walls 421b, 422b along x situated substantially at equal distances from the openings 41b.

The positioning of the openings 41b and the parameters for etching the top Si 11 are preferably chosen so that the lateral wall 421b of this additional cavity 42b juxtaposed with the cavity 42 is based on the material of the second lateral layer 24. The stopping of the etching is in particular configured so that the second layer 24 has a residual width of between 20 nm and 50 nm (FIG. 14). This second residual layer 24 made from Si-p can thus advantageously serve as a nucleus having good crystalline quality for the following step.

Figure 15:
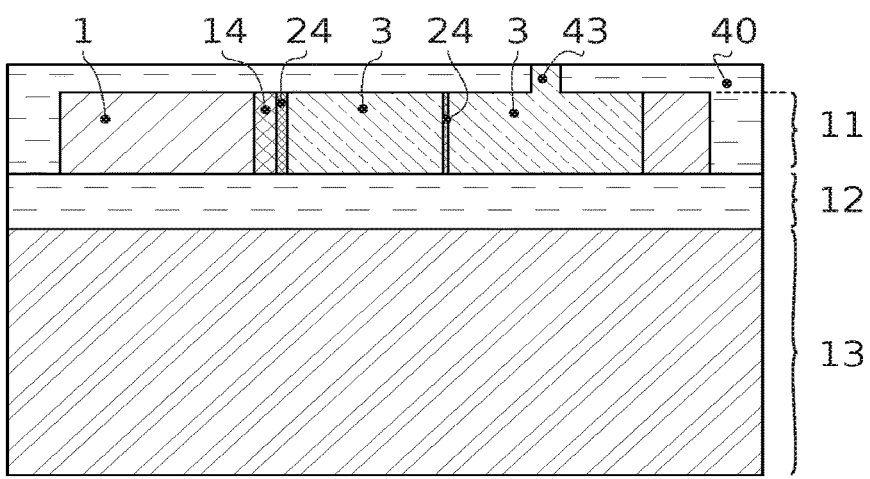

The following step consists of filling the additional cavity 42b by lateral epitaxy of germanium (FIG. 15). This filling is preferably carried out in accordance with the same filling conditions as those used for filling the cavity 42 disclosed above.

A planarisation step comprising for example anisotropic etching of the encapsulation layer 40b and chemical mechanical polishing (CMP) as far as the top Si 11 is preferably carried out.

Figure 16:
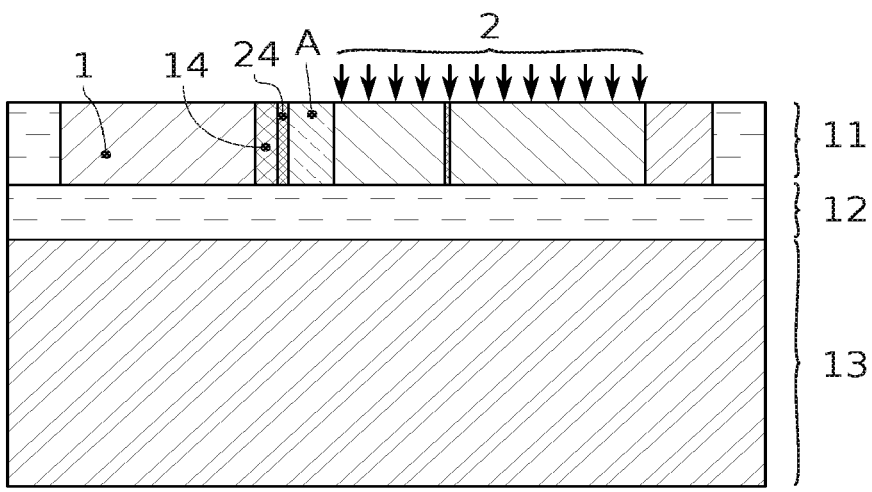

The second contact region 2 can next be formed by ion implantation of the germanium at least at the level of the previously filled additional cavity 42b, and preferably partly at the level of the previously filled cavity 42 (FIG. 16). This second contact region 2 may be p++ doped and have a concentration of dopants of between 1 and $3 \times 10^{19}$ $cm^{-3}$.

Figure 17:
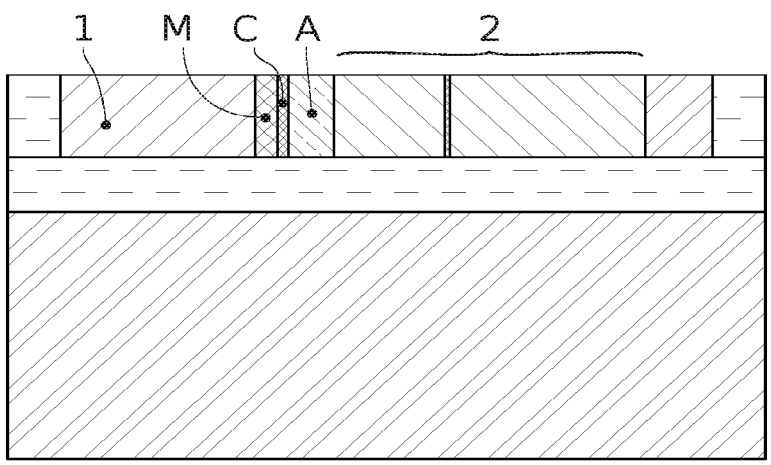
Figure 18:
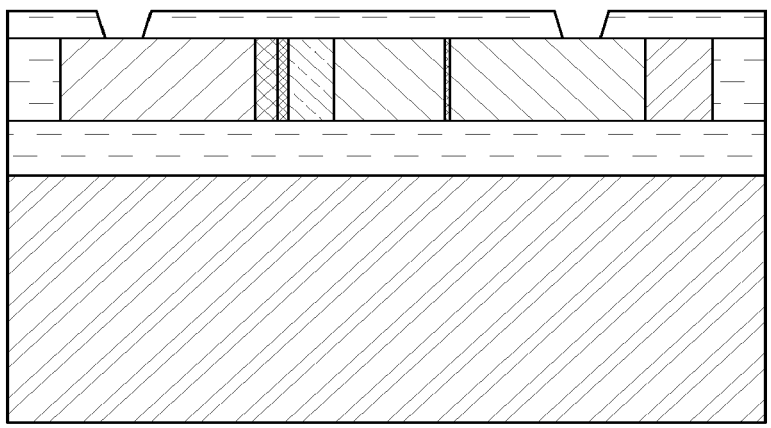

This second contact region 2 is preferably defined so as to obtain along y a continuous succession of the following regions:

The first contact region 1, then the multiplication region M, then the charge region C, then the absorption region A, and then the second contact region 2 so as to form laterally an SACM avalanche photodiode (FIG. 17).

The width of the second contact region 2 is chosen so that the absorption region A has a width of between 400 nm and 700 nm, preferably around 600 nm. For example, the width of the second contact region 2 may be between 4 μm and 5 μm.

The following steps may be conventional steps of forming metal contacts, comprising in particular the deposition of a dielectric layer, preferably made from $SiO_2$, the formation of through vias at the level of the first and second contact regions 1, 2 (FIG. 18), the deposition of the metal contacts 10, 20 in the vias and optional rapid thermal annealing (RTA) for activating the contacts 10, 20.

Figure 19A:
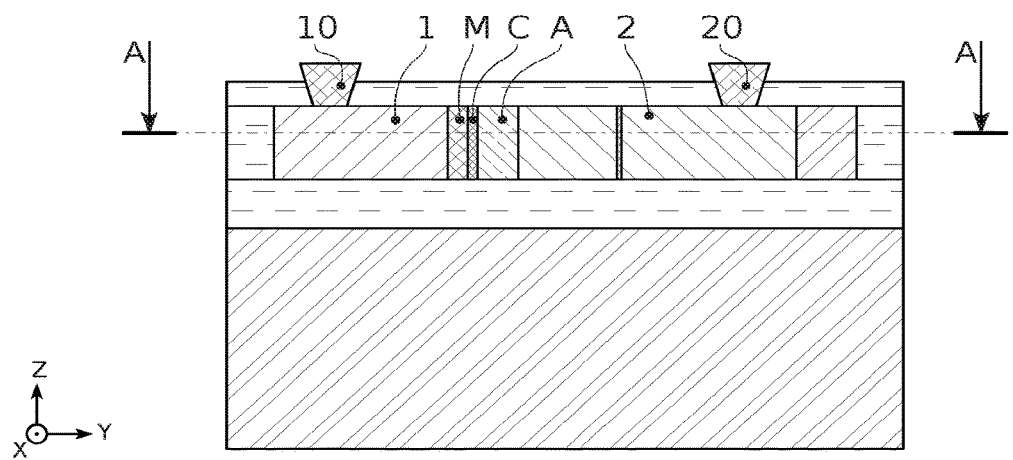
Figure 19B:
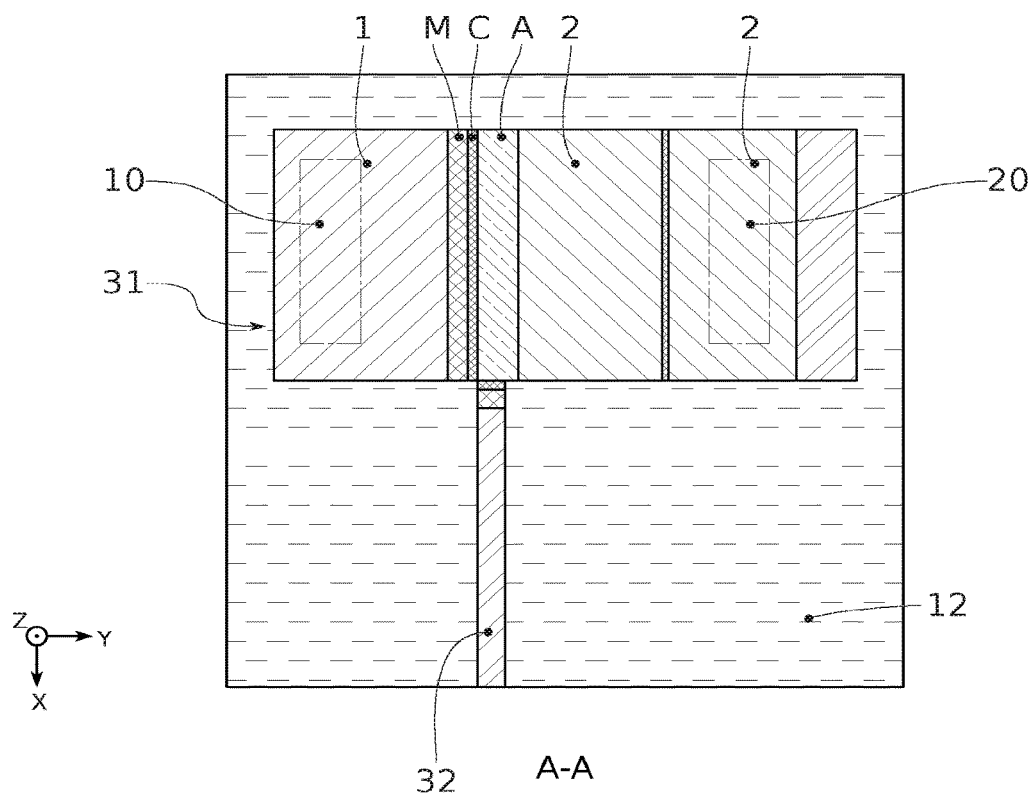
Figure 20:
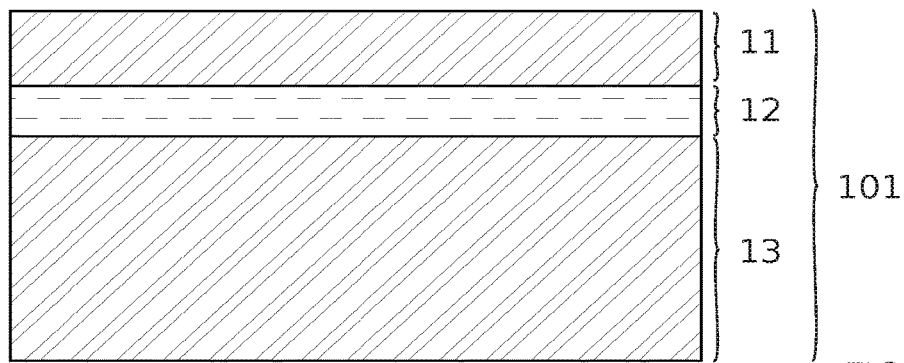
FIGS. 20 to 29 illustrate steps of producing a photodiode according to a second embodiment of the present invention.
Figure 21:
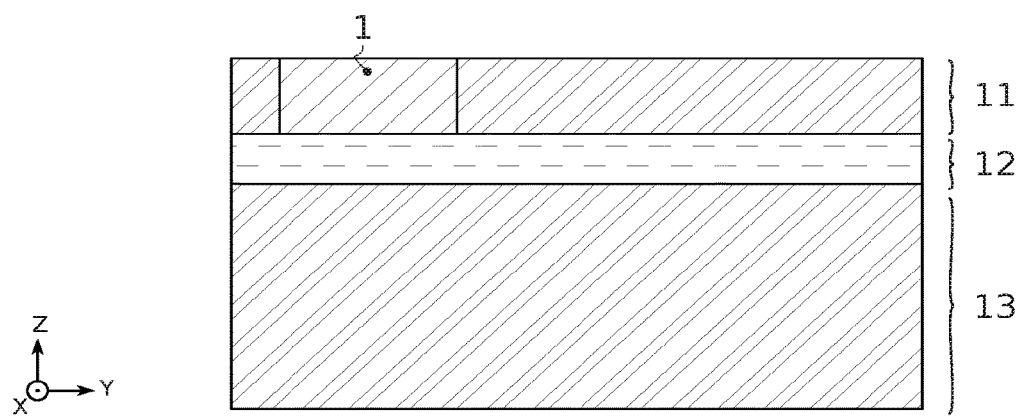
Figure 22A:
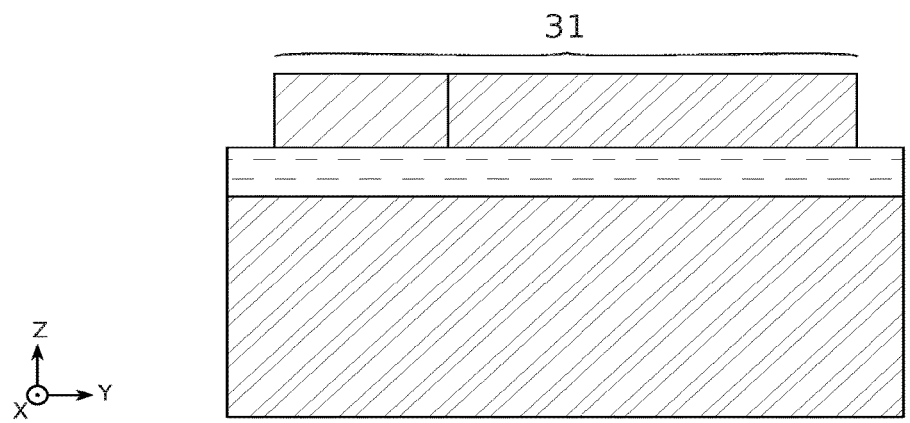
Figure 22B:
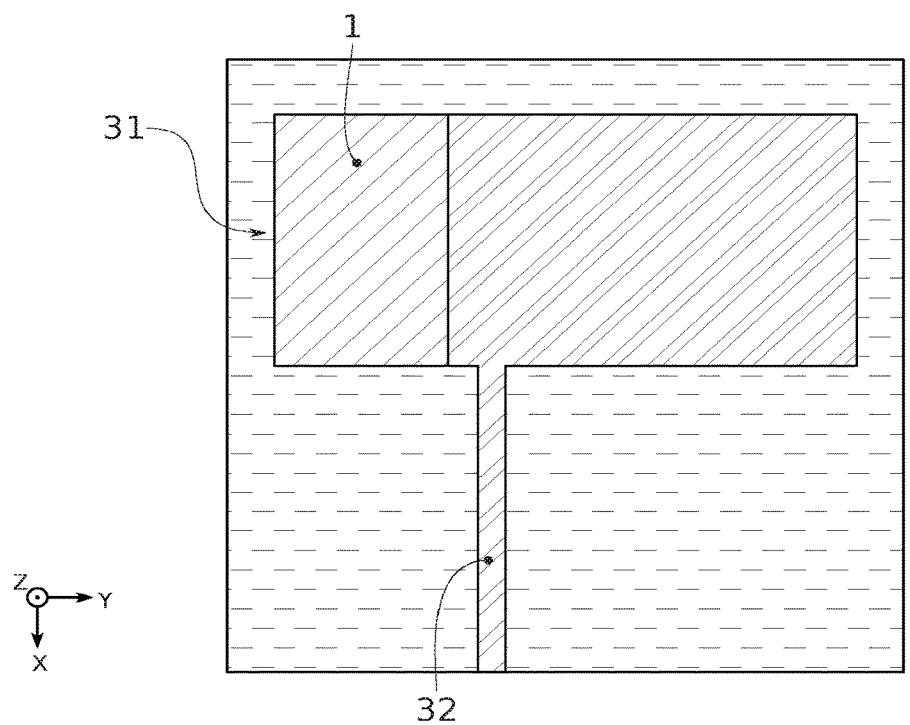
Figure 23:
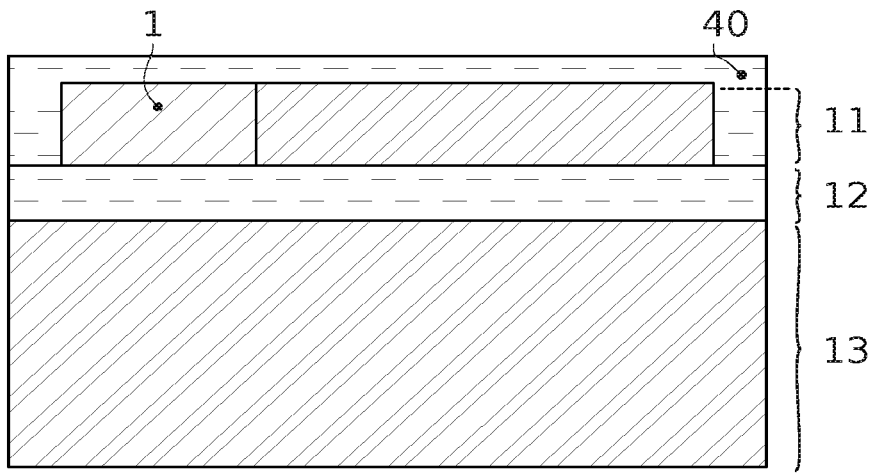
Figure 24:
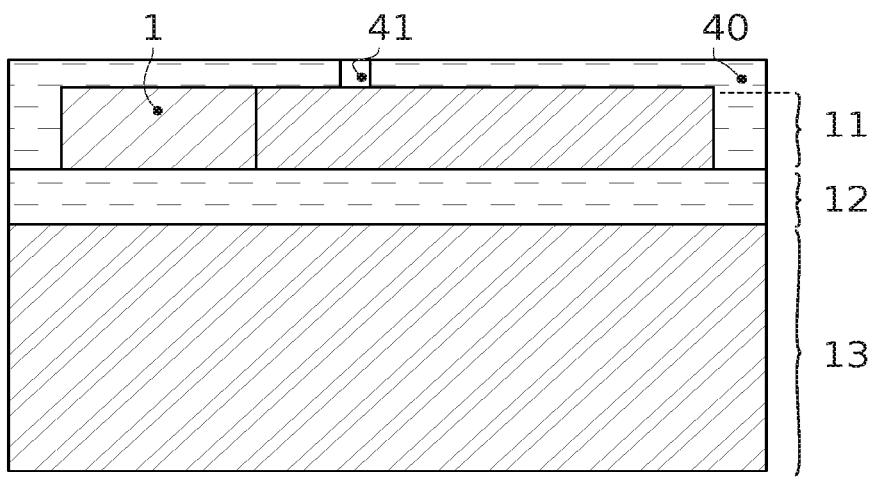
Figure 25A:
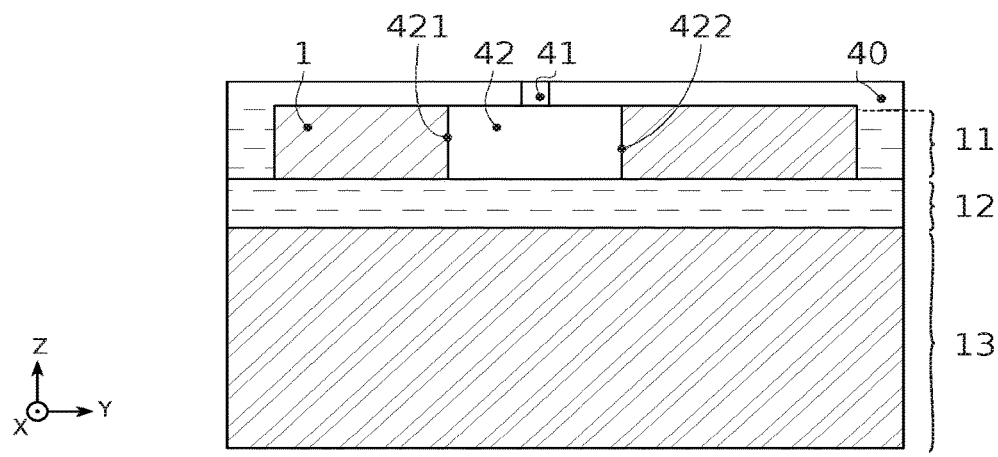
Figure 25B:
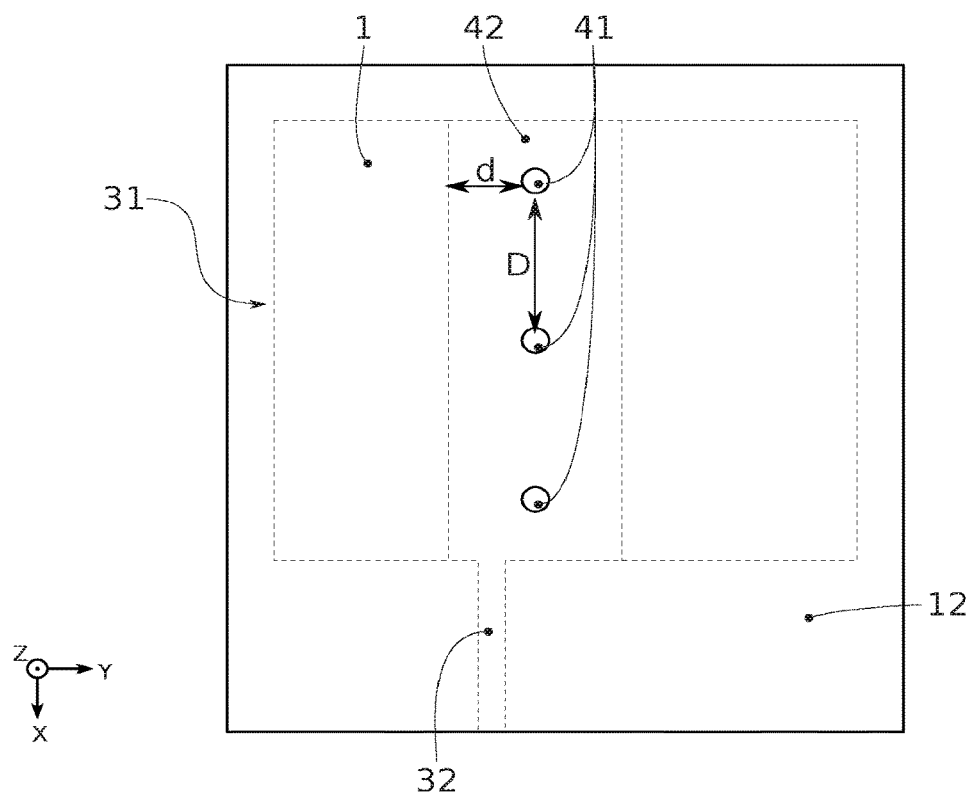
Figure 26:
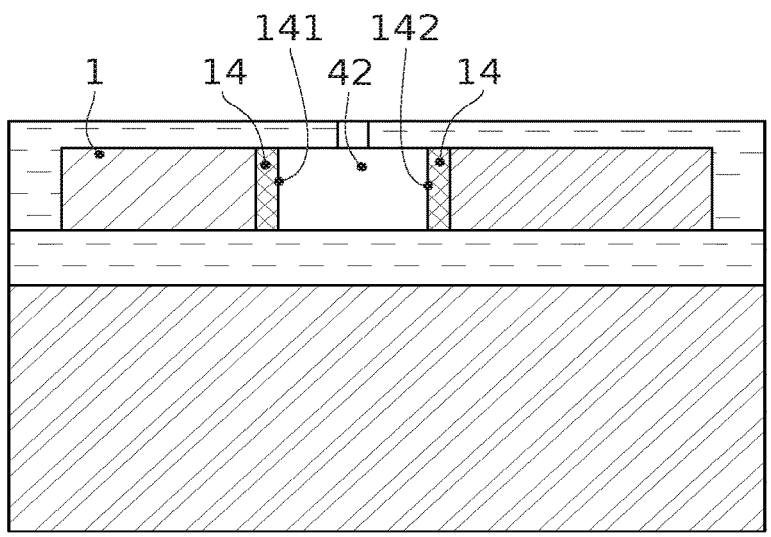
Figure 27:
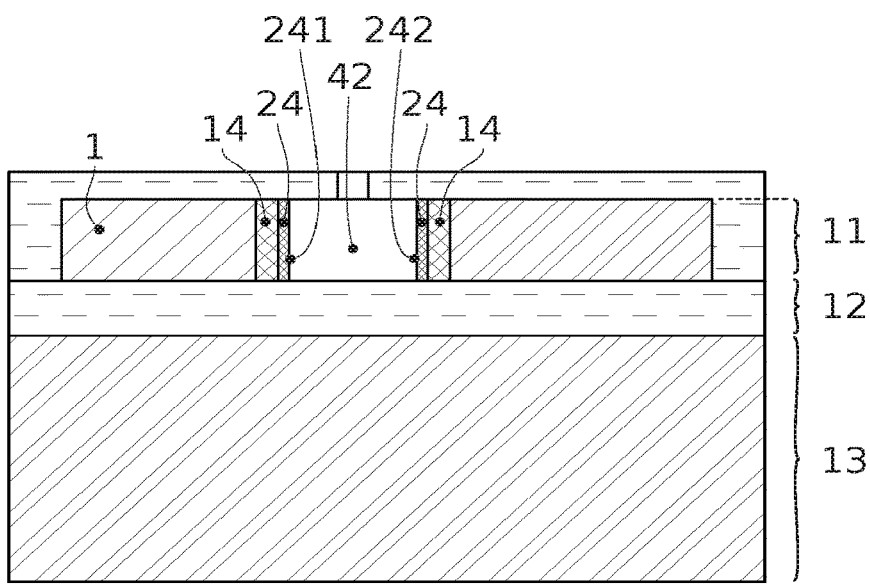
Figure 28:
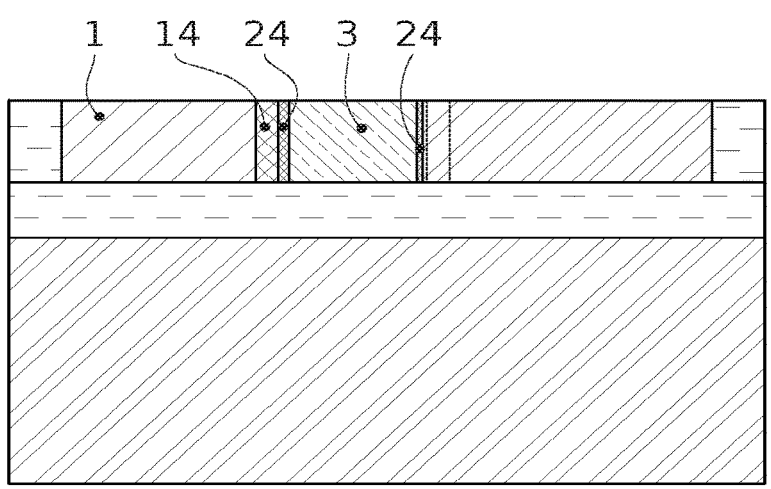

A GeOI lateral avalanche photodiode with single heterojunction is thus advantageously obtained (FIGS. 19A and 19B).

A second embodiment of the method according to the invention will now be described with reference to FIGS. 20 to 29. The photodiode obtained by this second embodiment is a GeOI lateral avalanche photodiode with double heterojunction.

Only the features distinct from the first embodiment are described hereinafter, the other features not described being deemed to be identical to those of the first embodiment described above with reference to FIGS. 4 to 19B.

The first steps of this second embodiment, illustrated in FIGS. 20 to 27, consist essentially of forming the first contact region 1, defining the first and second patterns 31, 32, encapsulating same, forming the openings 41 and the cavity 42, carrying out the first and second epitaxies of Si-i and then of Si-p, and filling 124 the cavity 42 by lateral epitaxy of germanium are steps common with the first embodiment.

Figure 29:
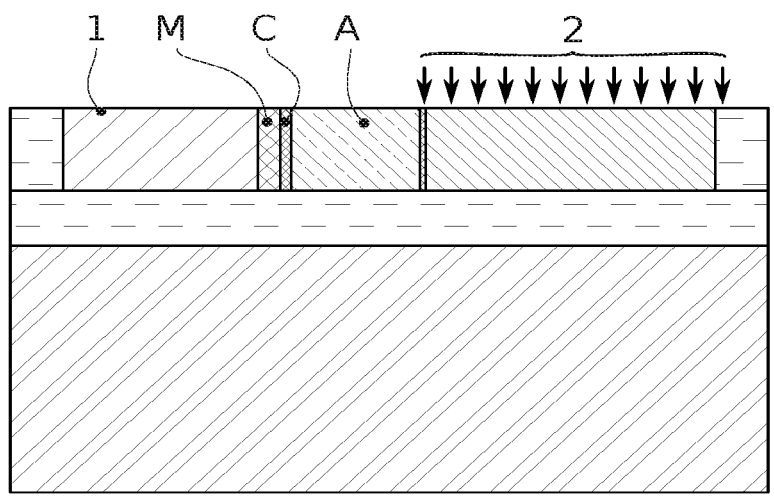

In this second embodiment, preferably after filling of the cavity 42 and planarisation (FIG. 28), the formation 120b of the second contact region 2 is carried out by ion implantation directly at the edge of the cavity 42 filled with germanium 3, on the side opposite to the first contact region 1 (FIG. 29).

The ion implantation may advantageously be configured so as to carry out a p++ doping of the silicon of the top Si 11, of the Si-i silicon of the first layer 14 and of at least part of the Si-p silicon of the second layer 24 at the edge of the filled cavity 42.

The second contact region 2 thus preferably covers the multiplication region M and at least part of the charge region C so as to form laterally a GeOI lateral avalanche photodiode in double-heterojunction SACM configuration (FIG. 29).

This photodiode may advantageously have along y the following succession of materials:

An n++ doped silicon (first contact region 1), an intrinsic silicon (multiplication region M), a p+ doped silicon (charge region C), an intrinsic germanium (absorption region A), a residual p+ doped silicon, a p++ doped silicon (second contact region 2).

These materials are preferably interposed along z between the BOX 12 of SiO2 and an $SiO_2$ oxide layer.

The photodiode obtained advantageously has an improved optical confinement of the absorption region A, and increased light-detection sensitivity.

A third embodiment of the method according to the invention illustrated in FIGS. 30 to 39 aims to obtain a double-heterojunction lateral p-i-n photodiode issuing from a first substrate 101 and transferred onto a second substrate 102.

Figure 30:
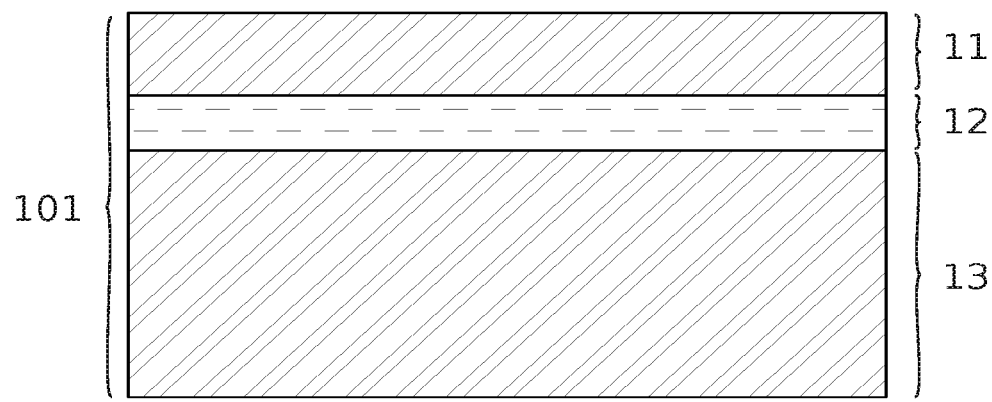
FIGS. 30 to 39 illustrate steps of producing a photodiode according to a third embodiment of the present invention.

According to this third embodiment, the first substrate 101 is preferably an SOI substrate (FIG. 30).

The first and second contact regions 1, 2 n++ and p++ are formed in the top Si 11, preferably by ion implantation. The first and second contact regions 1, 2 preferably have widths of approximately 15 µm.

Figure 31:
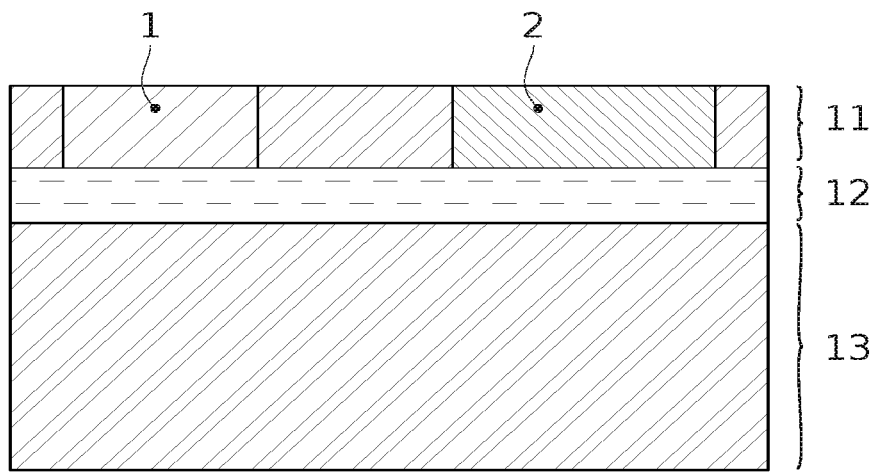

A region of top Si 11 that is not implanted and is interposed along y between first and second contact regions 1, 2 preferably has a width of around 1 µm (FIG. 31).

The first and second patterns 31, 32 can next be defined and encapsulated as before.

Figure 32:
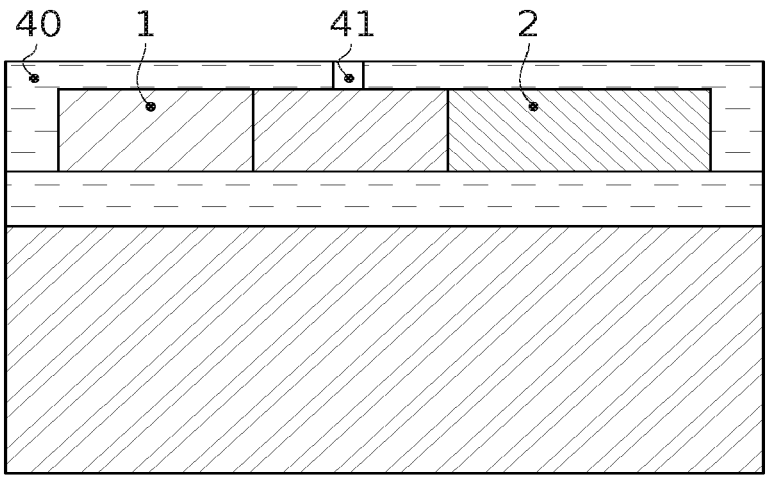

The openings 41 are formed in the encapsulation layer 40 so as to be centred along y on the non-implanted region (FIG. 32).

Figure 33:
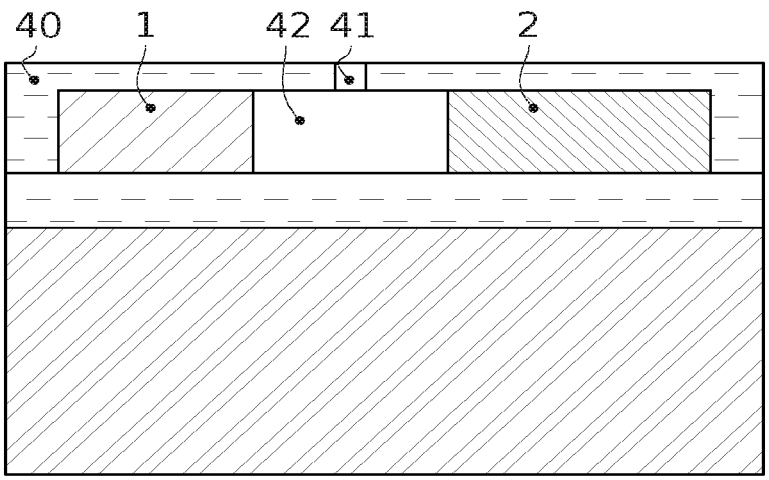

The non-implanted region is next etched so as to form a cavity 42 extending between the first and second contact regions 1, 2 (FIG. 33).

Figure 34:
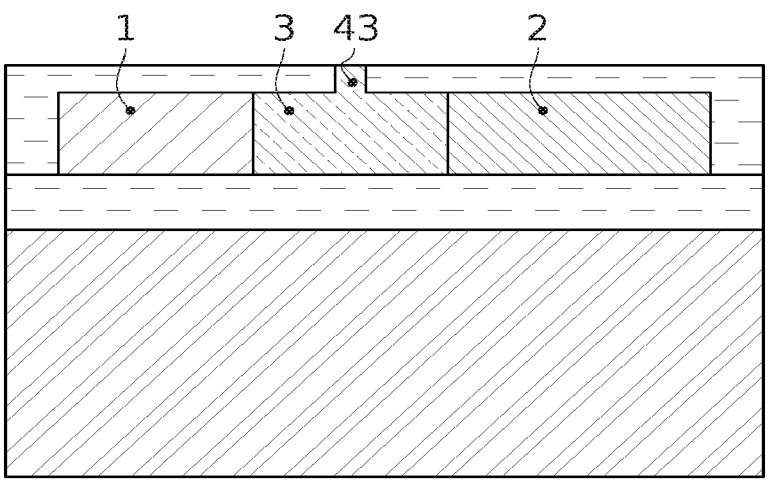

The cavity 42 can be filled by lateral epitaxy of germanium 3 according to the same filling conditions as those disclosed previously in the other embodiments of the invention (FIG. 34).

Figure 35:
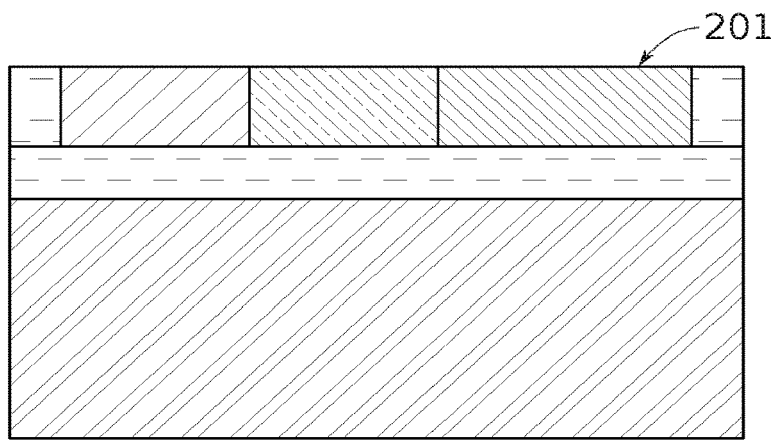

A planarisation step for eliminating the protrusions 43 of germanium 3 is preferably performed, exposing a flat face 201 of the p-i-n structure (FIG. 35).

Figure 36:
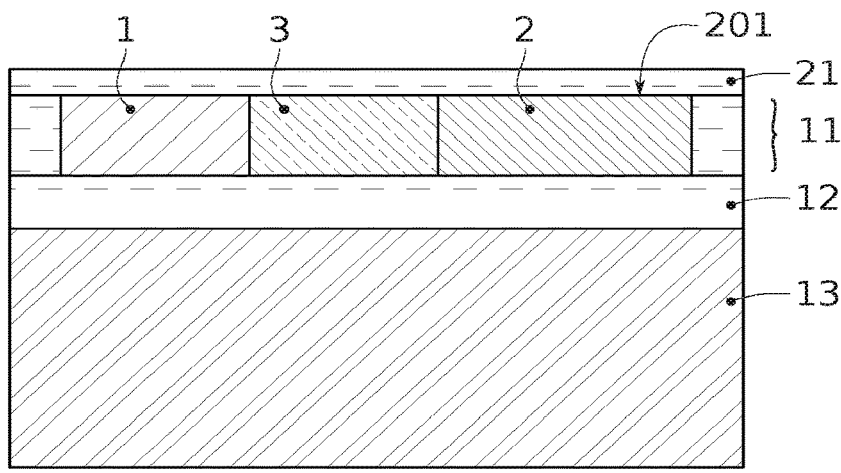

A deposition of a layer 21 of $SiO_2$ oxide, for example a CVD deposition using a TEOS (tetraethylorthosilicate) precursor, is carried out, preferably over the entire surface on the planarised face 201 (FIG. 36). This layer of oxide 21 may have a thickness of between a few tens of nanometres and a few microns.

Direct bonding between these first and second substrates 101, 102 is preferably carried out.

The second substrate 102 may for example be a silicon substrate 23 comprising optionally optoelectronic or microelectronic devices on a face 202. This second substrate 102 may also comprise III-V materials and/or devices of the silicon photonics type.

A deposition of oxide, for example by CVD using a TEOS precursor or by thermal oxidation, may be carried out on the face 202 of the second substrate 102 so as to form a layer of oxide 22 with a thickness of between a few hundreds of nanometres and a few microns.

A step of surface preparation of the faces 201, 202 of the first and second substrates 101, 102, comprising for example cleaning and hydrolysis, is preferably performed. The cleaning may be carried out for example in a bath of ozone-enriched deionised water. The hydrolysis may be carried out for example in a solution of ammonium peroxide (APM—ammonium peroxide mixture) at 70° C.

After preparation of the surfaces, the face 201 comprising the oxide 21 of the first substrate 101 is put in contact with the face 202 comprising the oxide 22 of the second substrate 102, at ambient temperature and pressure.

Figure 37:
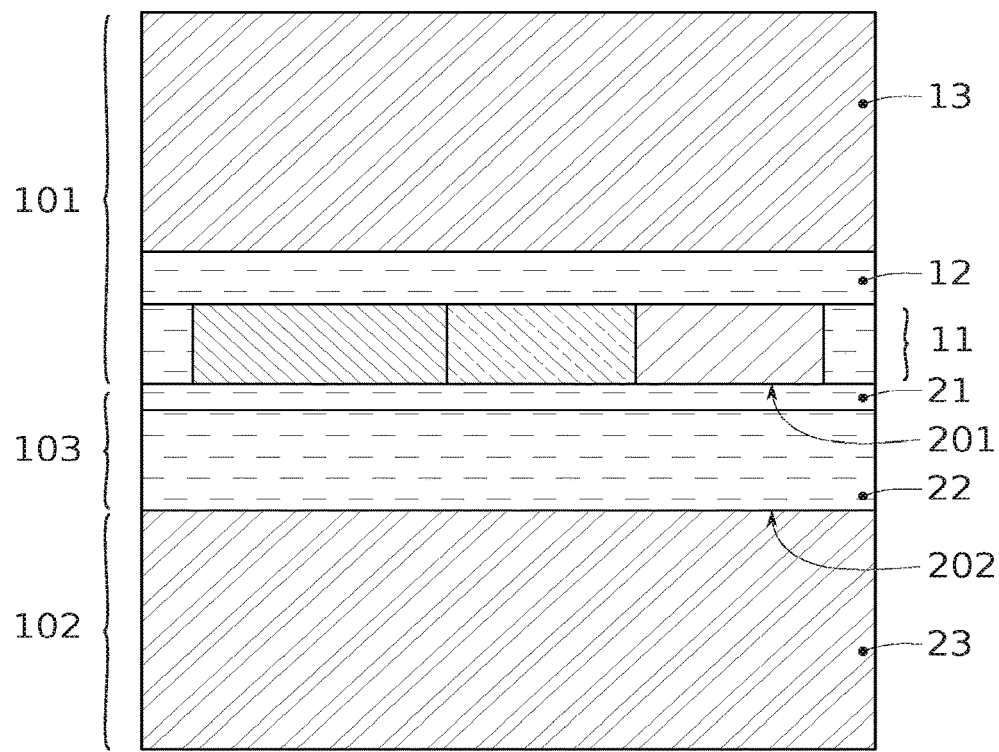
Figure 38:
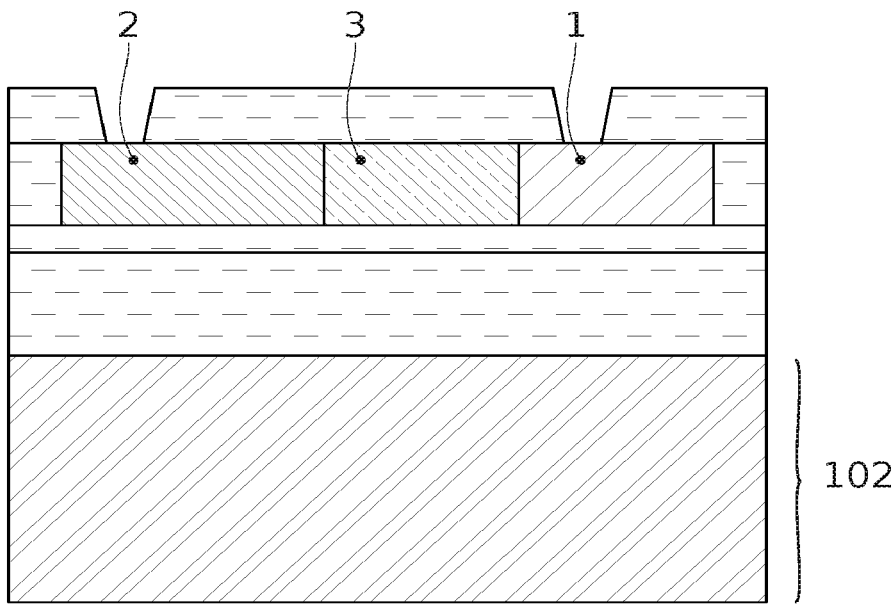

Annealing at 400° C. for two hours may next be carried out so as to finalise the direct bonding 103 by molecular adhesion between the oxides 21, 22 (FIG. 37).

For example, according to one possibility, a second substrate 102 based on III-V materials and preferably based on GaN may be bonded directly to the oxide layer 21 of the first substrate 101. After bonding, this second substrate 102 may consequently be treated or transformed by a series of technological steps so as to produce photonic devices and/or components.

A chip comprising at least one double-heterojunction GeOI lateral p-i-n photodiode and photonic components based on GaN can thus advantageously be produced.

According to another possibility the first substrate 101 may be turned over and transferred to a second substrate 102, for example made from silicon.

The bulk Si 13 of the first substrate 101 can next be removed, for example by trimming and abrasion over at least 95% of its initial thickness and then by selective etching in a solution based on tetramethylammonium hydroxide (TMAH), so as to expose the BOX 12.

This possibility makes it possible to obtain on the surface an oxide layer with a very well controlled thickness formed by the exposed BOX 12. Certain photonic components requiring such an oxide layer with a very well controlled thickness can consequently be formed on the exposed BOX 12. For example, a capacitive modulator comprising electrodes on either side of the BOX 12 with a very well controlled thickness can advantageously be formed. Such a modulator may in fact have improved precision on the values of the capacitance. The functioning thereof can thus advantageously be optimised.

Figure 39:
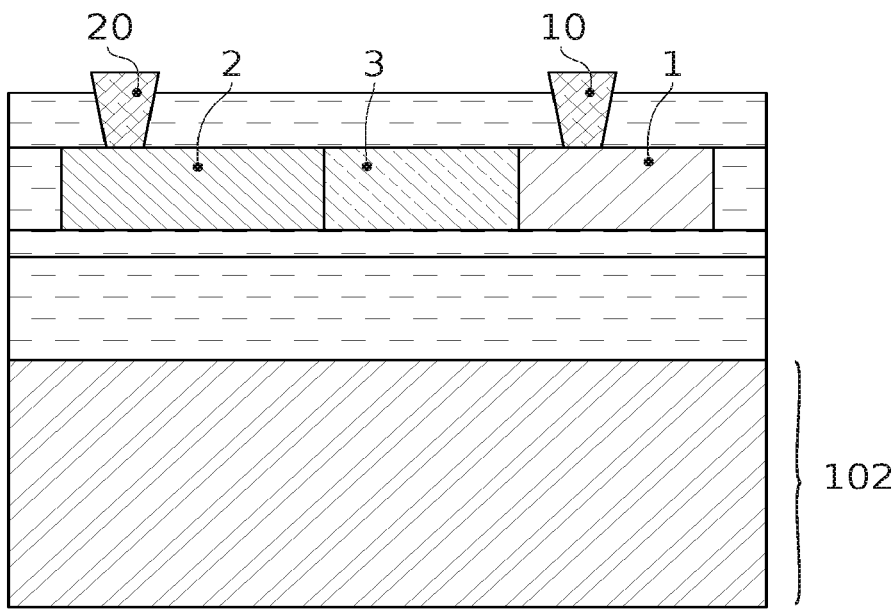

Through vias at the level of the first and second contact regions 1, 2 of the photodiode can next be formed (FIG. 38), and metal contacts 10, 20 can next be deposited at the level of the vias and then activated (FIG. 39).

Advantageously, the metal contacts 10, 20 have metal surfaces fitting flush with the first and second contact regions 1, 2, in a plane defining a new upper edge of the absorption region A. The transport of charges and/or the optical confinement of such a lateral p-i-n photodiode is improved compared with a solution requiring etching vias through a germination layer 111.

A double-heterojunction GeOI lateral p-i-n photodiode transferred onto a second substrate 102 can thus be produced (FIG. 39).

A chip comprising at least one double-heterojunction GeOI lateral p-i-n photodiode on a first face of the BOX 12, and for example at least one capacitive modulator partly on a second face of the BOX 12 opposite to the first face, can thus advantageously be obtained.

The method according to the invention makes it possible to obtain GeOI p-i-n lateral photodiodes and GeOI avalanche lateral photodiodes.

Such photodiodes also constitute a separable aspect of the invention.

The invention is not limited to the embodiments described above and extends to all embodiments covered by the claims.

The invention claimed is:

1. A method for producing a photodiode comprising a first contact region, a second contact region and an absorption region all juxtaposed so as to extend parallel in a first direction, said absorption region being situated between the first contact region and second contact region in a second direction, said method comprising the following steps:
   providing a first substrate comprising a stack in a third direction of a first layer based on a first material on a second layer based on a second material different from the first material,
   forming the first contact region at a level of the first layer,
   forming the second contact region at a level of the first layer, and forming the absorption region at a level of the first layer, wherein the formation of the absorption region comprises at least the following successive steps:
  encapsulating the first layer, at least in a region corresponding to the absorption region, by means of an encapsulation layer,
  forming at least one opening through the encapsulation layer so as to expose a region of the first layer,
  forming a cavity at least at the level of the absorption region, said formation comprising a removal of the first material over an entire thickness of the first layer through the at least one opening, the cavity comprising a bottom face based on the second material of the second layer, a top face formed by a part of the encapsulation layer and a plurality of lateral walls extending in the third direction, said plurality comprising at least one lateral wall based on the first material extending in the first direction at an edge of one from among the first contact region and second contact region, and
  filling, through the at least one opening, the cavity with a third filling material by lateral epitaxial growth of said material at least from the at least one lateral wall of the cavity, the growth being mainly directed in the second direction.

2. The method according to claim 1, wherein the plurality of lateral walls of the cavity form a closed contour.

3. The method according to claim 1, wherein the formation of the at least one opening is configured so that an exposed region of the first layer is situated outside the absorption region, preferably at a distance greater than 1 μm from the absorption region.

4. The method according to claim 1, wherein the first material and the third material each have a crystallographic structure of the cubic type, and wherein the first direction corresponds to a crystallographic orientation of type [100], the second direction corresponds to a crystallographic orientation of the [010] type, and the third direction corresponds to a crystallographic orientation of the [001] type.

5. The method according to claim 1, further comprising, when the cavity is formed after removal of the first material, the following step:
  forming, on at least one lateral wall bordering at least one from among the first contact region and second contact region, a first lateral layer of a material based on the first material but different from the first material, intended to form a multiplication layer of the photodiode.

6. The method according to claim 5, wherein the formation of the first lateral layer is performed by a lateral epitaxial growth mainly in the second direction.

7. The method according to claim 5, further comprising, after the formation of the first lateral layer, the following step:
  forming, on at least one lateral wall of the first lateral layer, a second lateral layer based on the first material but different from the first material and from the material of the first lateral layer, intended to form a charge layer of the photodiode.

8. The method according to claim 7, wherein the formation of second lateral layer is performed by a lateral epitaxial growth mainly in the second direction.

9. The method according to claim 1, wherein the first substrate comprises a third layer, so that the second layer is interposed between the first layer and the third layer in the third direction, the method further comprising a sequence of steps of turning over the photodiode on a second substrate, said sequence comprising the following steps:
  providing a second substrate,
  bonding the second substrate by molecular adhesion to the first substrate in the third direction, the first layer of the first substrate being turned facing the second substrate, and
  removing the third layer from the first substrate.

10. The method according to claim 1, further comprising a formation, at a level of a top layer, of a waveguide in direct coupling with the absorption region.

11. The method according to claim 1, wherein the at least one opening has a closed contour and is distant from the first contact region by a distance d in the second direction such that 0.6 μm<d<1.5 μm and preferably 1.1 μm<d<1.5 μm.

12. The method according to claim 1, wherein the lateral epitaxial growth of the filling material takes place at a first temperature T1 over a first time t1 such that 400° C.<T1<450° C. and 1 min<t1<20 min, and then at a second temperature T2 between 600° C. and 750° C. over a second time t2 chosen so as to fill the entire cavity.

13. The method according to claim 1, wherein the first material, when the cavity is formed, is removed by etching, said etching being configured so as to produce an etching speed at least 25% greater in crystallographic directions [110] and [1-10] than in crystallographic directions [010] and of the first material of the first layer, and preferably at least 35% greater.

14. The method according to claim 1, wherein the first material is silicon, the second material is a dielectric material such as a silicon oxide, and the third material is germanium.

15. The method according to claim 1, further comprising a formation of an additional cavity juxtaposed with the cavity and extending parallel thereto in the first direction, said formation comprising the following steps:
  encapsulating the first layer, at least in a region juxtaposed with the cavity, by means of an encapsulation layer,
  forming at least one additional opening through the encapsulation layer so as to expose a region of the first layer at the level of the region juxtaposed with the cavity, and
  removing the first material over the entire thickness of the first layer through the at least one additional opening, said additional cavity comprising a bottom face based on the second material of the second layer, a top face formed by a part of the encapsulation layer and a plurality of lateral walls extending in the third direction, said plurality comprising at least one lateral wall based on the first material extending in the first direction at the edge of the cavity.

16. The method according to claim 15, wherein the additional cavity is formed after filling of the cavity.

17. The method according to claim 15, wherein the formation of the additional cavity is configured so that said additional cavity is separated from the cavity in the second direction by a layer based on the first material having a dimension in said second direction that is less than or equal to 50 nm.

18. The method according to claim 15, further comprising, after formation of the additional cavity, a filling of said additional cavity through the at least one additional opening with the third filling material by a lateral epitaxial growth of said material at least from the at least one lateral wall of the additional cavity, the growth being mainly directed in the second direction.

19. The method according to claim 18, wherein the formation of one from among the first contact region and the second contact region is done by ion implantation at least partly at a level of the additional cavity after filling thereof.

20. A photodiode comprising:
- a first contact region and a second contact region both formed in a first layer based on a first material, and
- an absorption region located in a cavity situated in the first layer,
- the first contact region, the second contact region and the absorption region being juxtaposed so as to extend parallel in a first direction, and
- said absorption region being situated between the first contact region and the second contact region in a second direction, the first layer being in contact with a second layer based on a second material different from the first material, in a third direction perpendicular to the first and second directions, said absorption region being configured so as to confine light,
- wherein the absorption region is formed over the entire thickness of the first layer and comprises a third material different from the first and second materials and directly in contact with the second material of the second layer, and
- wherein the first material is silicon, the second material is a dielectric and the third material is germanium.

21. The photodiode according to claim 20, further comprising a multiplication region formed over the entire thickness of the first layer and interposed between the first contact region and the absorption region.

22. The photodiode according to claim 21, further comprising a charge region formed over the entire thickness of the first layer and interposed between the multiplication region and the absorption region.

23. The photodiode according to claim 22, wherein the multiplication region is configured to form a lateral growth base of the charge region.

24. The photodiode according to claim 20, wherein an index contrast between the second material and the third material is greater than an index contrast between the first material and the third material.

* * * * *